US012718193B1

(12) United States Patent
Alameh et al.

(10) Patent No.: US 12,718,193 B1
(45) Date of Patent: Aug. 25, 2026

(54) OPERATION OF SELF-CAPACITIVE SENSOR APPARATUS

(71) Applicant: AMAZON TECHNOLOGIES, INC., Seattle, WA (US)

(72) Inventors: Rachid M. Alameh, Crystal Lake, IL (US); Frederick Hershel Savage, Austin, TX (US); Jiri Slaby, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 525 days.

(21) Appl. No.: 18/186,739

(22) Filed: Mar. 20, 2023

(51) Int. Cl.
*G06Q 10/087* (2023.01)
*G01R 27/26* (2006.01)
*G06F 3/041* (2006.01)

(52) U.S. Cl.
CPC ....... *G06Q 10/087* (2013.01); *G01R 27/2605* (2013.01); *G06F 3/0418* (2013.01)

(58) Field of Classification Search
CPC .. G01R 27/2605; G01R 35/005; G01R 27/28; G01R 27/26; G01D 5/24; H03K 17/955; H03K 17/9622; H04B 5/22
USPC .......................................................... 324/636
See application file for complete search history.

(56) References Cited

U.S. PATENT DOCUMENTS 7,225,980 B2 6/2007 Ku et al.
7,949,568 B2 5/2011 Fano et al.
8,009,864 B2 8/2011 Linaker et al.
8,189,855 B2 5/2012 Opalach et al.
8,630,924 B2 1/2014 Groenevelt et al.
9,123,018 B2 9/2015 Gentile et al.
9,235,928 B2 * 1/2016 Medioni ................. G06T 17/00
(Continued)

FOREIGN PATENT DOCUMENTS

CN 202261392 U 5/2012
CN 103177353 A 6/2013
WO 20060111468 10/2006

OTHER PUBLICATIONS

McAndrew, Christopher P., "Non-final Office Action dated Feb. 4, 2025", U.S. Appl. No. 18/186,749, The United States Patent and Trademark Office, Feb. 4, 2025.
(Continued)

*Primary Examiner* — Olusegun Goyea
(74) *Attorney, Agent, or Firm* — Weaver Austin Villeneuve & Sampson LLP

(57) ABSTRACT

An apparatus for use at an inventory location stowing items comprises an array of sensor elements. Each sensor element comprises a plurality of conductive elements that may be driven as a self-capacitance sensor. A set of one or more sensor elements may be associated with a particular lane. Based on the changes in self-capacitance values and the association, the lane a user interacted with may be determined. The determination of the set of sensor elements associated with a particular lane may be determined during a setup process. During operation, the conductive elements may be driven to compensate for changes in the self-capacitance resulting from temperature changes resulting from changes in ambient temperature or the items. Compensated capacitance data may be used to determine interaction data, count of items in the lane, and so forth. Sensor elements at one or both ends of a lane may be used to disambiguate interactions.

20 Claims, 27 Drawing Sheets

(56) References Cited

U.S. PATENT DOCUMENTS

| | | | | |
|---|---|---|---|---|
| 9,727,838 | B2 * | 8/2017 | Campbell | G06Q 10/087 |
| 9,911,048 | B2 * | 3/2018 | Jones | H04N 7/183 |
| 9,984,355 | B2 * | 5/2018 | Jones | G06Q 10/087 |
| 10,007,892 | B1 * | 6/2018 | Hahn | H04B 5/22 |
| 10,365,764 | B2 | 7/2019 | Korapati et al. | |
| 11,087,274 | B1 * | 8/2021 | Hahn | G01D 5/24 |
| 12,413,228 | B1 * | 9/2025 | Alameh | G01R 27/2605 |
| 2006/0071774 | A1 * | 4/2006 | Brown | G06Q 30/02 340/522 |
| 2007/0050271 | A1 | 3/2007 | Ufford et al. | |
| 2007/0261894 | A1 | 11/2007 | Harish | |
| 2009/0114041 | A1 * | 5/2009 | Harish | G06Q 10/087 73/862.626 |
| 2011/0011936 | A1 | 1/2011 | Morandi et al. | |
| 2011/0153466 | A1 | 6/2011 | Harish et al. | |
| 2011/0187376 | A1 | 8/2011 | Barrenscheen et al. | |
| 2012/0284132 | A1 | 11/2012 | Kim et al. | |
| 2013/0222135 | A1 | 8/2013 | Stein et al. | |
| 2013/0284806 | A1 | 10/2013 | Margalit | |
| 2014/0239982 | A1 | 8/2014 | Alameh et al. | |
| 2015/0041616 | A1 * | 2/2015 | Gentile | A47F 10/00 248/550 |
| 2015/0086107 | A1 | 3/2015 | Dedeoglu et al. | |
| 2016/0026032 | A1 * | 1/2016 | Moore | G06F 3/147 349/1 |
| 2017/0108370 | A1 | 4/2017 | Pyne et al. | |
| 2017/0124603 | A1 * | 5/2017 | Olson | H04W 4/02 |
| 2021/0152175 | A1 * | 5/2021 | Buttolo | H03K 17/955 |
| 2023/0082721 | A1 * | 3/2023 | Wardlaw | G01R 27/2605 324/636 |

OTHER PUBLICATIONS

"Capacitive Sensing Basics" , Texas Instruments, CapActive Technology Guide 1.83.00.08, https://software-dl.ti.com/msp430/msp430_public_sw/mcu/msp430/CapTIvate_Design_Center/latest/exports/docs/users_guide/html/CapTIvate_Technology_Guide_html/markdown/ch_basics.html.

"Proximity Design Guide", Atmel, 18 pages, https://ww1.microchip.com/downloads/en/Appnotes/doc10760.pdf.

Asthana, et al. "An Indoor Wireless System for Personalized Shopping Assistance" CiteSeerX, In Proceedings of IEEE Workshop on Mobile Computing Systems and Applications, 1994. Retrieved from the Internet: http://citeseerx.ist.psu.edu/viewdoc/summary?doi=10.1.1.127.3033&rank=1.

Baxter, L. K., "Capacitive Sensors" , pp. 1-17.

Kalnikaite, et al., "How to Nudge In Situ: Designing Lambent Devices to Deliver Salient Information in Supermarkets", UbiComp '11, Sep. 17-21, 2011, Beijing, China, pp. 11-20. ACM 2011. Retrieved from the Internet: URL: http://www.researchgate.net/publication/221568350_How_to_nudge_in_Situ_designing_lambent_devices_to_deliver_salient_information_in_supermarkets.

Lamarca, Anthony, et al., "Pervasive Computing", Proceedings of the Fifth International Conference on Pervasive Computing, May 13-16, 2007, 29 pages. Toronto, 2007.

Metzger, Christain, et al. "Flexible-Foam-Based Capacitive Sensor Arrays for Object Detection at Low Cost." Applied PhysicsLetters, vol. 92, No. 1, 2008, p. 013506, doi:10.1063/1.2830815.

Pop, Cristian, "Introduction to the BodyCom Technology" AN1391, DS01391A, Microchip Technology, Inc., May 2, 2011, 26 pages. Retrieved from the Internet: http://www.microchip.com//wwwAppNotes/AppNotes.aspx?appnote=en555156.

Wang, David, "Capactive Sensing: Ins and Outs of Active Shielding", Texas Instruments, Application Report SNOA926A, Feb. 2015, 13 Pages. https://www.ti.com/lit/an/snoa926a/snoa926a.pdf?ts=1678951315659&ref_url=https%253A%252F%252Fwww.google.com%252F.

* cited by examiner

500

TOP VIEW
502

SENSOR ELEMENT
150(1)

CONDUCTORS
270

SENSOR ELEMENT
150(N)

"C"
"C"

Z
X
Y

SIDE VIEW
(ENLARGED)
504

FIRST ASSEMBLY
510

COVER LAYER
306

T53
T51
T52

CONDUCTIVE
ELEMENT
250(1)
250(2)

250(3)

T54

INSULATOR
308(1)

W51
W53

308(2)

SENSOR ELEMENT
150(1)

SENSOR ELEMENT
150(2)

W52

SECOND ASSEMBLY
512

TOP VIEW
602

CONDUCTORS
270

SENSOR ELEMENT
150(1)

SENSOR ELEMENT
150(N)

"D"

"D"

Z

X

Y

SIDE VIEW
(ENLARGED)
604

COVER LAYER
306

250(3)

CONDUCTIVE
ELEMENT
250(1)

250(2)

W61

W62

INSULATOR
308

SENSOR ELEMENT
150(2)

SENSOR ELEMENT
150(1)

ITEM
106

ITEM
106

ITEM
MANAGEMENT
ACCESSORY
702

GAP
704

COVER LAYER
306

CONDUCTIVE
ELEMENT
250(1)

250(2)

250(3)

250(4)

SENSOR ELEMENT
150(1)

INSULATOR
308

1000

LANE
104

LANE
104

ITEM LOCATION
CONFIGURATION
1002

ITEM COUNT
CONFIGURATION
1004

SENSOR ELEMENT
150(1)

ACTIVE ELEMENT
1006

ACTIVE ELEMENT
1006

SENSOR ELEMENT
150(2)

ACTIVE ELEMENT
1006

CAPACITANCE
1104

TIME (SECONDS)
1102

FIRST ITEM REMOVED
1120

HAND APPROACHES AND PLACES THE FIRST ITEM
1122

HAND APPROACHES WITH A SECOND ITEM
1126

HAND REMOVED (FIRST ITEM REMAINS)
1124

SECOND ITEM REMAINS
1128

2100

DETERMINE, AT A FIRST TIME, FIRST CAPACITANCE DATA USING A FIRST SET OF SENSOR ELEMENTS OPERATED IN A FIRST MODE
2102

DETERMINE, AT A SECOND TIME, SECOND CAPACITANCE DATA USING THE FIRST SET OF SENSOR ELEMENTS OPERATED IN A SECOND MODE
2104

DETERMINE FIRST COMPENSATION DATA BASED ON THE FIRST AND SECOND CAPACITANCE DATA
2106

DETERMINE, BASED ON THE FIRST CAPACITANCE DATA AND THE FIRST COMPENSATION DATA, FIRST COMPENSATED CAPACITANCE DATA
2108

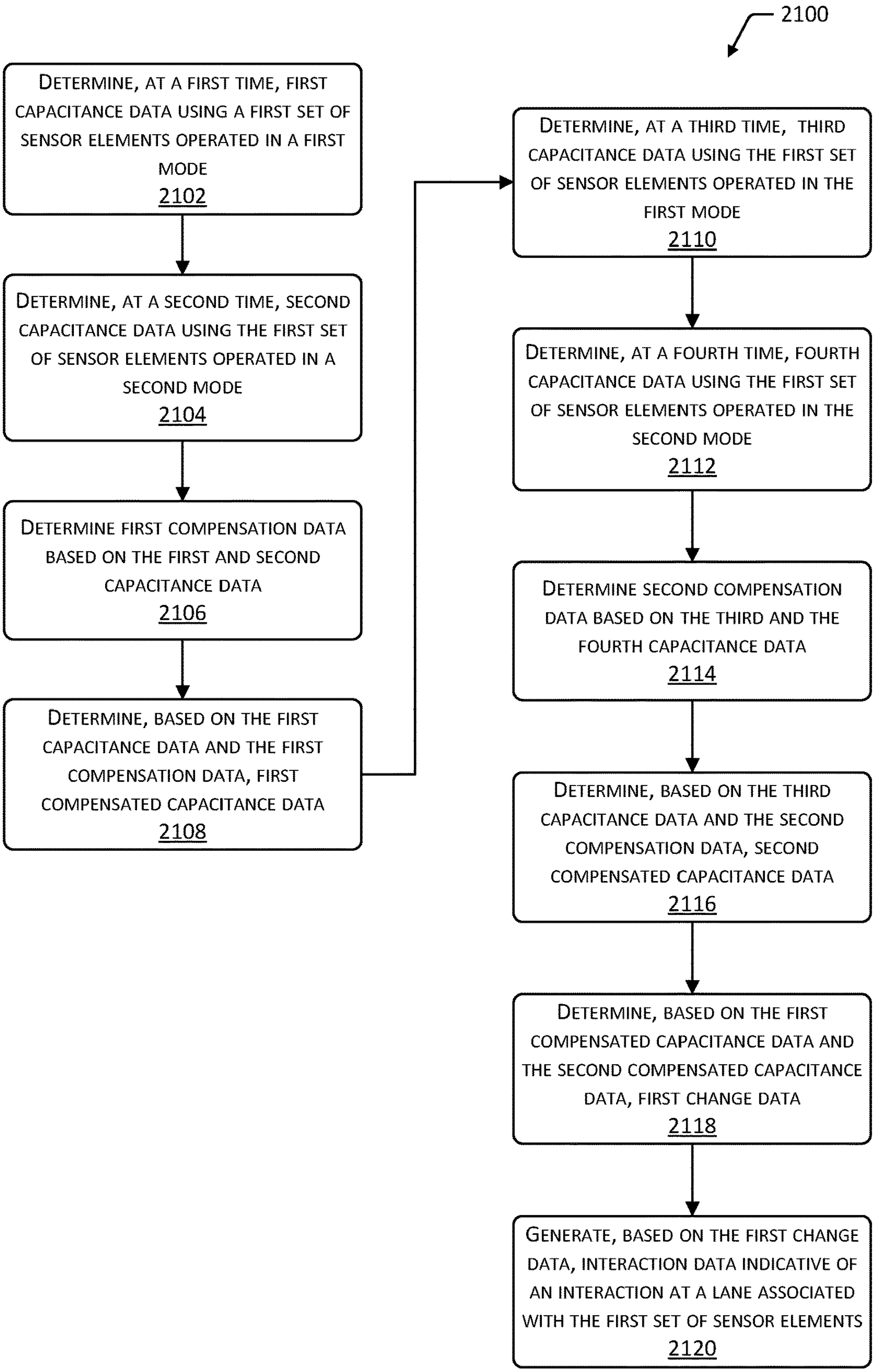

FIG. 21

OPERATION OF SELF-CAPACITIVE SENSOR APPARATUS

BACKGROUND

Product distributors typically maintain an inventory of various items that may be ordered, purchased, leased, borrowed, rented, viewed, and so forth, by clients or customers. For example, an e-commerce website may maintain inventory in a fulfillment center. When a customer orders an item, the item is picked from inventory, routed to a packing station, packed, and shipped to the customer. Likewise, physical stores maintain inventory in customer accessible areas, such as in a shopping area, and customers can pick items from inventory and take them for purchase, rental, and so forth.

Other examples of entities that maintain facilities holding inventory include libraries, museums, rental centers, and so forth. In each instance, for an item to be moved from one location to another, it is picked from its current location and transitioned to a new location. It is often desirable to monitor quantity or movement of inventory within the facility.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features. The figures are not necessarily drawn to scale, and in some figures, the proportions or other aspects may be exaggerated to facilitate comprehension of particular aspects.

FIG. 21 is a flow diagram of a process for using the apparatus to determine compensation data, according to some implementations.

Figure 1:
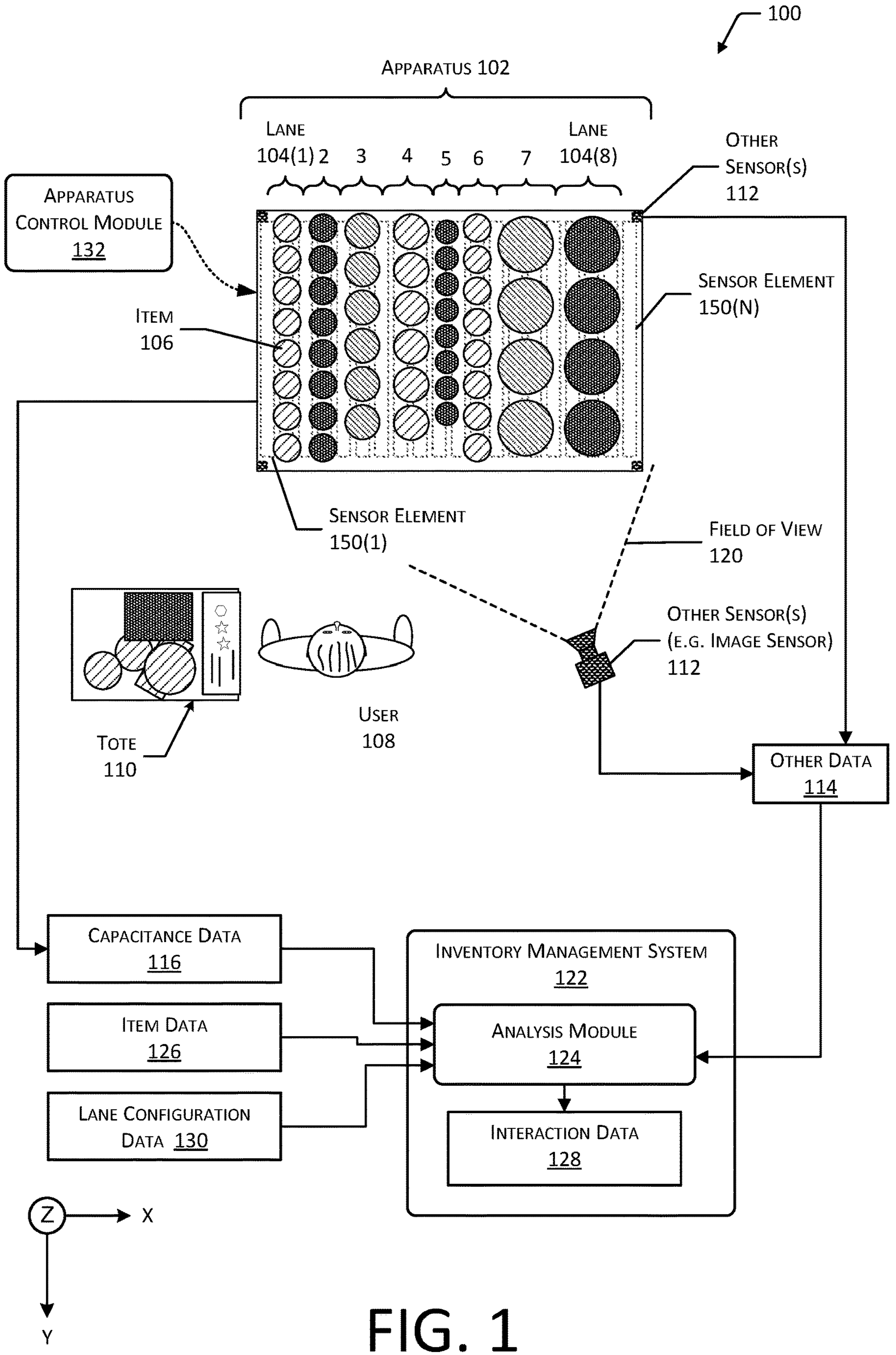
FIG. 1 illustrates a system using an apparatus comprising capacitive sensors to generate interaction data about an inventory location, according to some implementations.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean "including, but not limited to".

DETAILED DESCRIPTION

Described in this disclosure are systems and techniques for generating interaction data at an inventory location that may be used in a materials handling facility (facility). The facility may include, or have access to, an inventory management system. The inventory management system may be configured to maintain information about items, users, condition of the facility, and so forth. For example, the inventory management system may maintain data indicative of a number of items at a particular inventory location, what items a particular user is ordered to pick, how many items have been picked or placed at the inventory location, requests for assistance, environmental status of the facility, and so forth.

Operation of the facility may be facilitated by using one or more sensors to acquire information about interactions in the facility. The inventory management system may process the sensor data from the one or more sensors to determine interaction data. The interaction data is indicative of an action such as picking or placing an item at a particular inventory location, presence of the user at the inventory location, and so forth. For example, the inventory management system may use the sensor data to generate interaction data that determines a type of item a user picked from a particular inventory location.

An inventory location may include shelves, hangers, and so forth, or a portion thereof that holds or otherwise supports a type of item. The inventory location may comprise a section, such as individual lanes, of a larger inventory location, such as a shelf. For example, a shelf may have eight lanes, with each lane holding a specified type of item. Items may be added to (placed) or removed (picked) from the inventory location, moved from one inventory location to another, and so forth.

An apparatus comprising a plurality of capacitive sensors may be used at or in conjunction with an inventory location. For example, the apparatus may comprise a mat that rests on a shelf or may be integrated into the shelf. In some implementations the inventory location may be in view of sensor range of other sensors such as image sensors. An inventory management system may use the data from these sensors to determine the interaction data.

The capacitive sensors of the apparatus comprise electronics and a plurality of sensor elements, each sensor element in turn comprising a plurality of conductive elements. Objects on or above the sensor elements may result in a particular electrical capacitance of the particular sensor element. For example, the presence of an item may result in a first capacitance value while the absence of the item may result in a second capacitance value. Given a previously known arrangement of the sensor elements with respect to the apparatus, an estimated location of an interaction or an object may be determined. For example, a particular set of sensor elements may be associated with lane 1, and a change in the capacitance as measured by that particular set of sensor elements may indicate an interaction has taken place at that lane. The interaction may include an item being picked from or placed to the inventory location, presence of a hand of the user, presence of a manipulator of a robot, and so forth.

The sensor elements, and their respective conductive elements, may comprise a variety of different arrangements. In one arrangement, individual sensor elements may be approximately rectangular and arranged such that their long axis extends from a front of the apparatus to a back of the apparatus. One or more individual sensor elements may be associated with a particular lane. Based on a change in capacitance, an interaction may be associated with a particular lane. In another arrangement, the sensor elements may be arranged as right triangles, with two triangles arranged such that their respective longest sides are adjacent to one another. A location of an object may be determined with respect to these triangular conductive elements based at least in part on a ratio or difference between the capacitance values obtained by each. For example, the first capacitance value obtained using a first triangular conductive element and a second capacitance value obtained using a second triangular conductive element may be approximately the same when a homogenous object is located proximate to the midpoints of the longest sides of each triangle.

The sensor elements may be configured to utilize self-capacitance of the conductive elements, rather than a mutual capacitance. In one implementation, a known charge may be provided to the conductive element, and the resultant voltage may be measured between the conductive element and the ground. An active shield comprising an electrical conductor may be arranged along one or more sides of the conductive element. For example, the shield may be separated from the conductive element by an electrical insulator. During operation, the shield may be driven to the same, (or a substantially similar) electrical potential as that provided to the conductive element. As a result of this, a voltage difference that is below a threshold voltage is present between the shield and the conductive element. In some implementations, the voltage difference may be zero. The shield in this configuration may direct the electric field generally away from the shield. This directionality may be used to prevent erroneous readings for objects on the back side of the conductive element, such as may occur in an unshielded configuration. In some implementations, a ground plane may be arranged behind the shield, opposite the conductive element. The ground plane may comprise an electrically conductive material that is separated from the shield by an electrical insulator. The ground plane may be connected to an earth ground in some implementations. Proximity of an object to the conductive element or contact by the object to the conductive element affects the charge on the conductive element, producing a change in the resultant voltage that may then be measured and used to determine a capacitance value.

Each sensor element may comprise a plurality of conductive elements in various arrangements. These arrangements allow for various options with regard to fabrication and deployment. In a first arrangement, three conductive elements are stacked vertically, and separated by an electrical insulator. In a second arrangement, the apparatus comprises two assemblies that are joined for operation: a first assembly that comprises two conductive elements stacked vertically, and a second assembly that adds a third conductive element. In the second arrangement, some sensor elements may comprise only two conductive elements, as provided by the first assembly, while some sensor elements may comprise the two conductive elements plus the third afforded by the added second assembly. In other arrangements, various combinations of different widths and relative spacing between the conductive elements may be used. Other arrangements of the conductive elements are also described.

The sensor elements, and their respective electrical conductors, are connected to control circuitry using a plurality of conductors. The control circuitry, plurality of conductors, and sensor elements may be arranged such that the apparatus may be cut to allow customized widths (left to right) and depths (front to back) to be achieved. For example, the apparatus may be trimmed from 1.2 meters wide to 1 meter wide to fit a shelf.

During operation, a switch module may comprise circuitry used to switch or selectively connect a capacitive sensor module to a particular conductive element. Once connected, a charge may be applied to the conductive element. A voltage, capacitance, resistance, or other electrical characteristic may be measured by the capacitive sensor module which may then generate capacitance data.

The switch circuitry may be used to operate various configurations of conductive elements and provide different operational modes. In a first mode, or sensing mode, the sensor element is operated to determine capacitance of conductive elements that provide an electrical field that would impinge on a load of the apparatus, such as within a lane where an item may be stowed. In a second mode, or compensation mode, the sensor element is operated to determine capacitance between two conductive elements of the sensor element, allowing for compensation due to variations resulting from manufacture, ambient temperature, temperature of an item stowed at the apparatus, and so forth.

The switch circuitry may be operated to provide various scan modes. In an individual scan mode, individual sensor elements and their respective conductive elements are connected and used to determine the capacitance value of the sensor element. In a selective scan mode, previously determined sets of sensor elements and their respective conductive elements are connected and used to determine the capacitance value of the respective sets. In a global mode the switch circuitry may connect to all of the sensor elements to determine a capacitance value that is then used to determine proximity of an object, such as a user approaching the apparatus.

An event detection module may be used to generate event data associated with a particular inventory location. Event data may comprise information that is indicative of a change associated with an inventory location. For example, the event data may indicate that one or more types of sensor data have exceeded particular thresholds or met other conditions.

The event data may be used to trigger or initiate other actions, such as determination of interaction data. For example, event data may indicate occurrence of a change in capacitance values that exceeds a threshold value, change relative to a previously set baseline value, and so forth. Responsive to this, interaction data indicative of a pick or place of an item at the inventory location may be determined. In another example, the event data may be used to determine a time that an interaction took place. This time may then be used to determine other sensor data, such as from an image sensor or a weight sensor, that may be used to determine the interaction data.

By using the techniques described herein, operation of the facility may be improved. Details about interactions between users and items in the facility may be quickly and accurately determined. For example, as items are picked, placed, and so forth, information such as inventory levels based on changes in the count of items at the inventory locations may be readily and more accurately determined. As a result, the inventory management system may be able to quickly track what item a user has interacted with, maintain up-to-date inventory information, and so forth.

Illustrative System

FIG. 1 illustrates a system 100 comprising an apparatus 102 at an inventory location that provides data that is used to determine interaction data, according to some implementations. The apparatus 102 be associated with one or more lanes 104. The lanes 104 are specified areas upon or near the apparatus 102 that are associated with a particular type of item 106. For example, the apparatus 102 depicted here has eight lanes 104(1), 104(2), . . . and 104(8). A first lane 104(1) may be associated with storing some quantity of a first item 106(1) such as grape drink, while a second lane 104(2) may be associated with storing some quantity of a second item 106(2) such as orange drink, and so forth. The apparatus 102 may be arranged adjacent to one another. For example, a separate apparatus 102 may be associated with individual shelves on a rack.

A user 108 may interact with the lanes 104 associated with the apparatus 102. For example, the user 108 may remove (pick) a first item 106(1) from the first lane 104(1) and place the first item 106(1) into a tote 110. The tote 110 may be associated with the user 108 or that user's 108 user account. Items 106 may also be added to (placed) the lanes 104 of the apparatus 102. For example, a person or robot may restock the lane 104 with items 106.

Each apparatus 102 comprises one or more sensor elements 150, and in some implementations may include or be associated with one or more other sensors 112. The other sensors 112 may be positioned to gather information about one or more inventory locations, such as particular lanes 104 or the entire shelf. For example, the other sensors 112 may comprise one or more accelerometers, hygrometers, and so forth.

Circuitry associated with the other sensors 112 generates other data 114. For example, the other sensors 112 may comprise weight sensors arranged proximate to each of the four corners of the apparatus 102. Output from each weight sensor 112 may be used to produce the other data 114 that includes weight values for each of the corners at particular times. In another example, the other sensors 112 may comprise an image sensor, such as a camera having a field of view (FOV) 120 that includes at least a portion of the apparatus 102. Output from the image sensor 112 may be processed to determine the interaction data.

The apparatus 102 comprises one or more sensor elements 150(1)-(N). For example, the conductive elements of the sensor elements 150 may be located on, in, or below a surface of the apparatus 102 upon which items 106 may rest. Various structures and arrangements of the sensor elements 150 and their respective conductive elements are described in more detail in the following figures.

The sensor elements 150 are coupled to an apparatus control module 132 comprising capacitive sensing circuitry that generates capacitance data 116. The capacitive sensing circuitry may use various techniques to determine capacitance. For example, the capacitive sensing circuitry may include a source that provides a predetermined voltage, a timer, and circuitry to measure voltage of the conductive element relative to the ground. By determining an amount of time that it takes to charge the conductive element to a particular voltage, the capacitance may be calculated. The capacitive sensing circuitry may use one or more of analog or digital circuits to determine capacitance. During operation, one or more of the sensor elements 150 may be operated to determine capacitance data 116 indicating capacitance values at particular times and with respect to the different portions of the apparatus 102 associated with the set of sensor elements 150 that are operated.

In some implementations, each lane 104 or group of lanes 104 may be associated with one or more sensor elements 150. For example, each lane 104 may be associated with a single sensor element 150. In another example, the lanes 104 may span two or more sensor elements 150.

An inventory management system 122 may access the capacitance data 116 and, in some implementations, the other data 114. The inventory management system 122 may be configured, as described below, to perform various functions such as tracking changes to a quantity on hand of the items 106 at the apparatus 102.

The inventory management system 122 may include or have access to an analysis module 124. The analysis module 124 may access information including, but not limited to, item data 126, lane configuration data 130, capacitance data 116, event data, other data 114, or other information.

The item data 126 provides information about a particular type of item 106, including characteristics of that type of item 106 such as physical dimensions, where that type of item 106 is located in the facility, characteristics about how the type of item 106 appears, capacitance values associated with the type of item 106, and so forth. For example, the item data 126 may indicate that the type of item 106 is “Brand X grape drink, 16 oz can” with a stock keeping unit (SKU) number of “24076513. The item data 126 may indicate the types and quantities of items 106 that are expected to be stored at that particular inventory location such as in a particular lane 104 on the apparatus 102, width and depth of that type of item 106, weight of the type of item 106 individually or in aggregate, sample images of the type of item 106, and so forth.

The item data 126 may include an item identifier. The item identifier may be used to distinguish one type of item 106 from another. For example, the item identifier may include a SKU string, Universal Product Code (UPC) number, radio frequency identification (RFID) tag data, and so forth. The items 106 that are of the same type may be referred to by the same item identifier. In other implementations, non-fungible items 106 may each be provided with a unique item identifier, allowing each to be distinguished from one another.

The item data 126 may include one or more of geometry data, item weight data, sample image data, sample capacitance data, or other data. The geometry data may include information indicative of size and shape of the type of item 106 in one, two, or three dimensions. For example, the geometry data may include the overall shape of an item 106, such as a cuboid, sphere, cylinder, and so forth. The geometry data may also include information such as length, width, depth, and so forth, of the type of item 106. Dimensional information in the geometry data may be measured in pixels, centimeters, inches, arbitrary units, and so forth. The geometry data may be for a single item 106, or a package, kit, or other grouping considered to be a single item 106.

The item weight data comprises information indicative of a weight of a single item 106, or a package, kit, or other grouping considered to be a single item 106. The item data 126 may include other data. For example, the other data may comprise weight distribution of the item 106, point cloud data for the item 106, and so forth.

The sample capacitance data may comprise data indicative of a previously measured or calculated change in capacitance of a representative sensor element 150 based on the presence or absence of a sample of the type of item 106. For example, during processing or intake of the item 106 at the facility, a sample of the type of item 106 may be placed on a sensor element 150 to generate the sample capacitance data.

The sample image data may comprise one or more images of one or more of that type of item 106. For example, sample image data may be obtained during processing or intake of the item 106 to be used by the facility.

The item data 126 may include one or more inventory location identifiers (IDs). The inventory location ID is indicative of a particular area or volume of an inventory location such as an apparatus 102 that is designated for stowage of the type of item 106. For example, a single apparatus 102 may be associated with several lanes 104, each with a different inventory location ID. Each of the different inventory location IDs may be associated with a lane 104 having a particular area on the apparatus 102 designated for storage of a particular type of item 106. A single type of item 106 may be associated with a particular inventory location ID, a plurality of inventory location IDs may be associated with the single type of item 106, more than one type of item 106 may be associated with the particular inventory location ID, and so forth.

The item data 126 may also include quantity data. The quantity data may comprise a count or value indicative of a number of items 106. The count may be a measured or an estimated value. The quantity data may be associated with a particular inventory location ID, for an entire facility, and so forth. For example, the same type of item 106 may be stored at different shelves 104 within the facility. The quantity data may indicate the quantity on hand for each of the different inventory locations.

The lane configuration data 130 may comprise information that associates particular sensor elements 150 of a particular apparatus 102 with a particular lane 104. For example, the first lane 104(1) of the apparatus 102 depicted may be associated with sensor element 150(2), while the eighth lane 104(8) of the same apparatus 102 depicted is associated with sensor elements 150(17)-150(19).

The analysis module 124 may utilize one or more of the capacitance data 116, event data, the other data 114, the item data 126, the lane configuration data 130, or other information to generate interaction data 128. The interaction data 128 is indicative of an action such as picking or placing an item 106 for a particular inventory location, presence of the user 108 at the inventory location, and so forth. Operation of the analysis module 124 is described in more detail below with regard to FIG. 12 and elsewhere.

Figure 2:
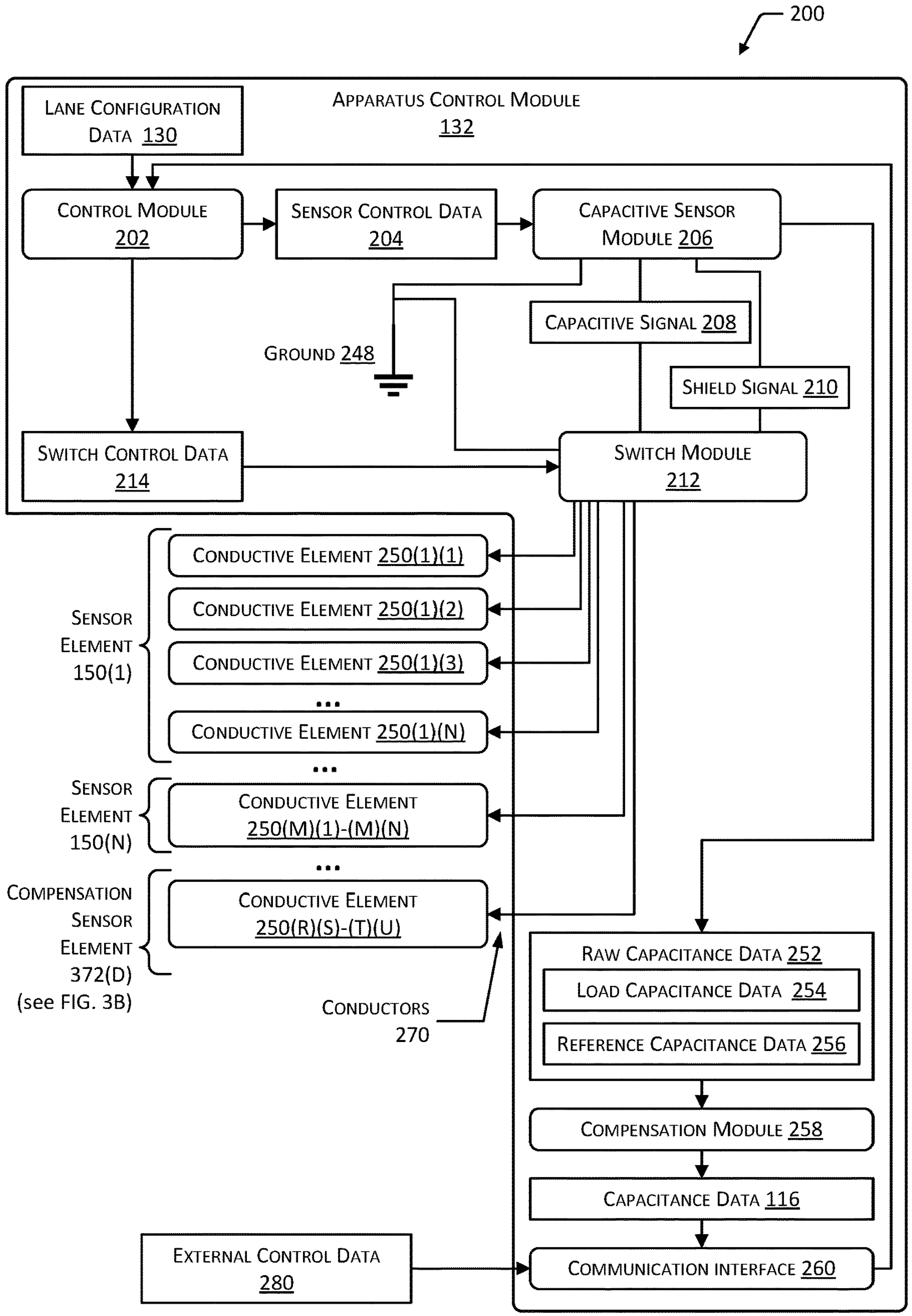
FIG. 2 illustrates a block diagram of the apparatus, according to some implementations.

FIG. 2 illustrates at 200 a block diagram of the apparatus 102, according to some implementations. The apparatus control module 132 may comprise a control module 202, a capacitive sensor module 206, a switch module 212, and a plurality of sensor elements 150(1)-(N). The apparatus control module 132 comprises electronic circuitry coupled together using electrical conductors, such as wires, circuit traces, and so forth. The electronic circuitry may comprise one or more processors, controllers, microcontrollers, programmable logic devices, and so forth that execute one or more instructions.

The control module 202 may generate sensor control data 204 that operates the capacitive sensor module 206. The capacitive sensor module 206 may comprise a capacitive signal source that generates a capacitive signal 208. During operation, the capacitive signal 208 may be used to supply a charge to one or more conductive elements 250 as distributed via the switch module 212. The capacitive sensor module 206 may comprise a shield signal source that generates a shield signal 210. During operation, the shield signal source may generate the shield signal 210 that is at the same voltage potential of the input of the capacitive signal 208. The shield signal 210 may then be used to supply a charge to the one or more conductive elements 250 as distributed with the switch module 212. This provides an actively driven shield, or active shield, in which there is no difference in electrical potential between the conductive elements 250 supplied with the capacitive signal 208 and the conductive elements 250 supplied with the shield signal 210. External interference may then couple to the conductive elements 250 driven as the active shield, producing little interaction with the conductive elements 250 being supplied by the capacitive signal 208. Using this technique, the sensor element 150 may detect objects on the side opposite that of the conductive element 250 driven by the shield signal 210, with that conductive element 250 preventing the sensor from "seeing" or being affected by an object behind the shield. The active driving technique also substantially improves the signal to noise ratio of the resulting capacitance data 116, improving overall performance.

Figure 3A:
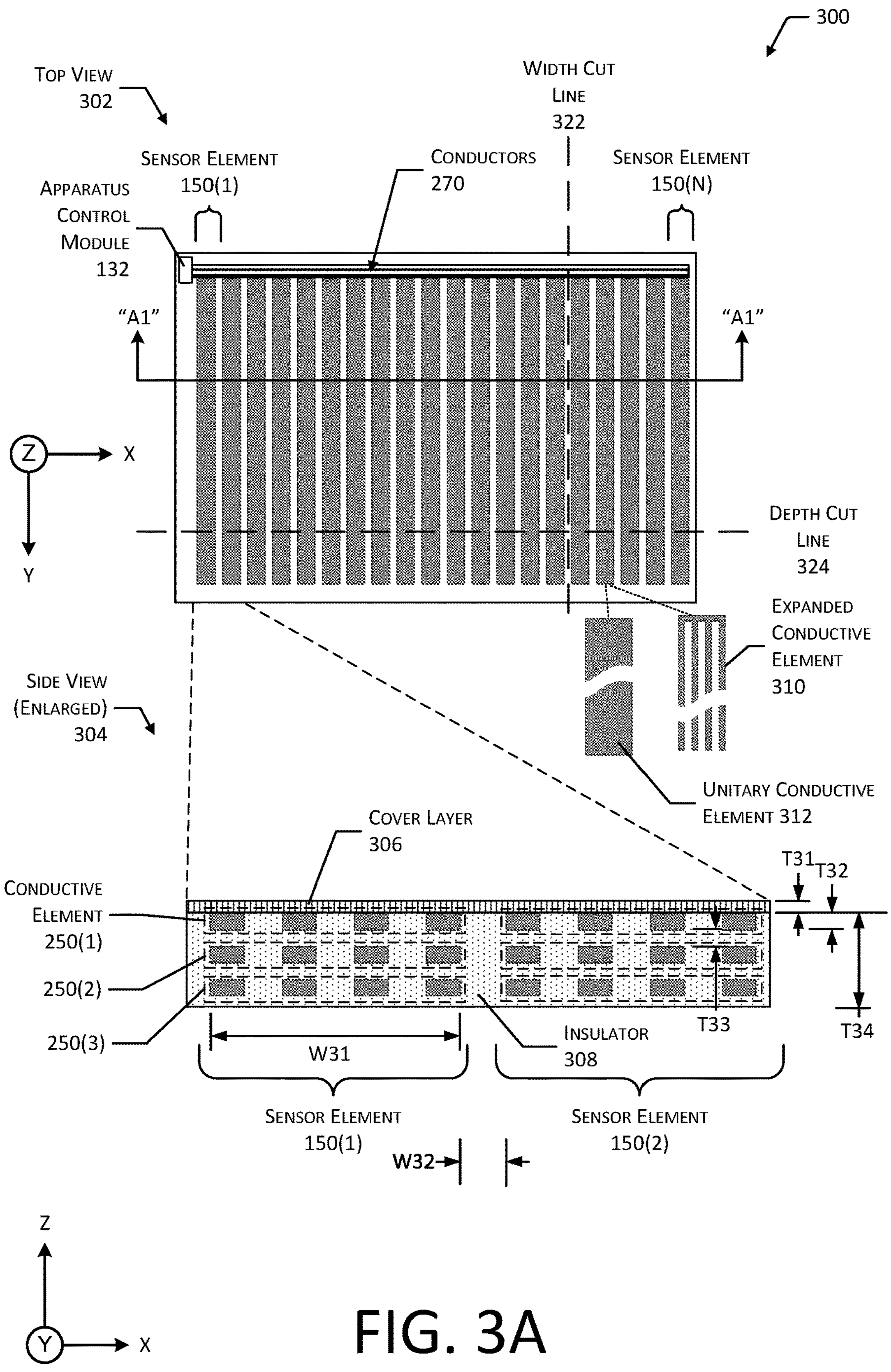
FIG. 3A illustrates a first arrangement of conductive elements of the sensor elements of the apparatus, according to some implementations.

In some implementations, the actively driven shield may be omitted. For example, the actively driven shield may be omitted if the overall thickness T34 of the apparatus 102, such as shown in FIG. 3A, exceeds a threshold amount.

The capacitive sensor module 206 may be operated in one or more different sensitivity modes. Different sensitivity modes may be characterized by one or more of different amplitudes of the capacitive signal 208, different integration times, different frequencies of operation, and so forth. For example, a high sensitivity mode may utilize a first amplitude of capacitive signal 208 that is greater than a second amplitude that is associated with a low sensitivity mode. While operating in the high sensitivity mode, the range of the electric field associated with operation may be extended. For example, the high sensitivity mode may be used to determine the approach of a user 108 or other object to the apparatus 102, while the low sensitivity mode is used to detect and characterize the pick or place of items 106 to an inventory location. The same sensor element 150 or set of sensor elements 150 may be operated at different sensitivity modes at different times. For example, at a first time a first set of sensor elements 150 may be operated at high sensitivity, and at a second time the same first set of sensor elements 150 may be operated at low sensitivity. The operating mode used may be dynamically adjusted. For example, a high sensitivity mode may be used to determine an approach of a user 108, and once detected, the apparatus 102 may transition to using the low sensitivity mode.

The control module 202 may also generate switch control data 214 that operates the switch module 212 to connect particular conductive elements 250 to particular portions of the capacitive sensor module 206. The switch module 212 comprises switch circuitry, such as one or more relays, transistors, or other devices that allow for the selective connection of conductive elements 250 to particular portions of the capacitive sensor module 206, the ground 248, and so forth. For example, the switch module 212 may selectively connect particular conductive elements 250 to the capacitive signal source, the shield signal source, ground 248, and so forth. Various switch configurations are discussed in the following figures. In some implementations, the ground 248 may provide a relatively high impedance path to a chassis ground, earth ground, and so forth.

The switch module 212 is connected to the respective conductive elements 250 of the sensor elements 150(1)-(N) by a plurality of conductors 270. In one implementation the plurality of conductors 270 may comprise electrically conductive traces on a rigid or flexible substrate. In some implementations, the apparatus 102 may utilize one or more multiplexing techniques, additional switch modules 212, and so forth.

In implementations in which compensation sensor elements 372 (see FIG. 3B) are present, the switch module 212 is connected to the respective conductive elements 250 of the compensation sensor elements 372(1)-(D) by a plurality of conductors 270. In one implementation, the plurality of conductors 270 may comprise electrically conductive traces on a rigid or flexible substrate. In some implementations, the apparatus 102 may utilize one or more multiplexing techniques, additional switch modules 212, and so forth.

The capacitive sensor module 206 provides as output raw capacitance data 252. The raw capacitance data 252 may comprise data, such as values indicative of capacitance with respect to the conductive elements 250 that are coupled to the capacitive signal source by the switch module 212 at a particular time. While operating in a first mode 1802, such as described below with regard to FIG. 18, the raw capacitance data 252 may comprise load capacitance data 254, indicative of the capacitance with respect to a portion of the sensor elements 150 that is associated with where items 106 may be stored. In comparison, while operating in a second mode 1804, such as described below with regard to FIG. 18, the raw capacitance data 252 may comprise reference capacitance data 256, indicative of the capacitance between particular conductive elements 250.

In some implementations, compensation sensor elements 372 (see FIG. 3B) may be used to determine the reference capacitance data 256. For example, the compensation sensor elements 372 may be operated to determine reference capacitance data 256 while the sensor elements 150 are operated to determine the load capacitance data 254.

A compensation module 258 may accept as input the raw capacitance data 252 and determine as output the capacitance data 116. In one implementation the compensation module 258 may subtract the reference capacitance data 256 from the load capacitance data 254 to determine the capacitance data 116. In another implementation the compensation module 258 may, based on the reference capacitance data 256, determine a correction factor. The load capacitance data 254 may then be multiplied by the correction factor to determine the capacitance data 116. In other implementations, other techniques may be used to determine the capacitance data 116.

In some implementations, operation of the compensation module 258 may be initiated based on other data 114. For example, based on an other sensor 112 comprising a hygrometer indicating a change in humidity that exceeds a threshold value, the compensation module 258 may be operated to update the reference capacitance data 256. In another example, based on an other sensor 112 such as an accelerometer indicating the apparatus 102 has been moved, the compensation module 258 may be operated to update the reference capacitance data 256.

In some implementations, the apparatus control module 132 may operate in a serial fashion, operating different combinations of sensor elements 150, compensation sensor elements 372, and so forth in series. For example, during a specified time interval, a particular set of sensor elements 150 or compensation sensor elements 372 may be operated to determine raw capacitance data 252.

The apparatus control module 132 may include a communication interface 260. The communication interface 260 may comprise one or more wired or wireless communication interfaces. For example, the communication interface 260 may comprise a WiFi communication interface to provide wireless communication with another device, such as the inventory management system 122.

In some implementations external control data 280 from an external source may be received by the communication interface 260 of the apparatus control module 132. For example, the inventory management system 122 may send external control data 280 specifying one or more parameters for operation of the apparatus control module 132, requesting capacitance data 116, and so forth.

FIG. 3A illustrates at 300 a first arrangement of conductive elements 250 of the sensor elements 150 of the apparatus 102, according to some implementations. A top view 302 of an apparatus 102 and a side view 304 of an enlarged portion of the apparatus 102 are depicted. The views are shown with respect to three mutually orthogonal axes. Relative to the apparatus 102 while placed in a generally flat orientation for use, the X axis extends left-to right (width), the Y axis extends back to front (depth) and the Z axis extends bottom to top (thickness).

As shown in the top view 302, a plurality of sensor elements 150(1)-(N) are distributed in a single row of columns across the apparatus 102, forming an array. The apparatus control module 132 is located in a corner, and the conductors 270 connect the conductive elements 250 of the sensor elements 150 to the apparatus control module 132.

The sensor elements 150 may comprise various configurations of conductive elements 250. In one implementation, an expanded conductive element 310 may comprise a plurality of conductive elements that are electrically connected to operate as a single conductive element. In comparison, in another implementation a unitary conductive element 312 may comprise a single contiguous conductive element.

In this illustration, the expanded conductive element 310 is depicted as having four electrically conductive traces that are electrically connected. In other implementations, other configurations may be used. Other examples of the expanded conductive element 310 such as a mesh pattern, hash pattern, hatch pattern, comb pattern, fractal pattern, and so forth may be used. In some implementations, an expanded conductive element 310 may comprise one or more electrical conductors that are electrically connected before connection to the switch module 212. This electrical connection may be distinct from the connectivity provided by the switch module 212. For example, the electrical connection between portions of the expanded conductive element 310 may be permanent.

The expanded conductive element 310 may have a conductor coverage ratio that is less than one. In one implementation the conductor coverage ratio may be calculated as a sum of the area of electrical conductors divided by the total area described by a boundary that encompasses the portions of the expanded conductive element 310. For example, a boundary that extends around the perimeter of a conductive element 250 may result in an area of 10 square millimeters. Within that 10 square mm, the expanded conductive element 310 may consist of four traces, each trace having a respective surface area of 1 square mm. As a result, the conductor coverage ratio in this example would be (1+1+1+1)/10=0.40.

Unless otherwise specified, the individual conductive elements 250 as used in this disclosure, such as with regard to sensor elements 150 or compensation sensor elements 372 (described with regard to FIG. 3B), may comprise expanded conductive elements 310, unitary conductive elements 312, or combinations thereof.

The arrangement of the apparatus control module 132, the sensor elements 150 and their respective conductive elements 250, and the conductors 270 may facilitate cutting the apparatus 102 along one or more of a width cut line 322 or a depth cut line 324. For example, the apparatus 102 may be cut to fit within a specified shelf.

The side view 304 depicts an enlarged portion of a cross section of the apparatus 102 along line "A1-A1". In the implementation shown, a cover layer 306 is provided. The cover layer 306 may comprise a dielectric material, such as non-conductive plastic, ceramic, and so forth. The sensor elements 150 are arranged beneath the cover layer 306. The cover layer 306 has a thickness T31. In some implementations, the cover layer 306 may comprise a portion of an electrical insulator 308.

In this implementation, each sensor element 150 comprises three conductive elements 250(1)-(3) that are stacked vertically with respect to one another. Each conductive element 250 in this illustration consists of a respective expanded conductive elements 310 comprising four electrical conductors that are electrically connected. Each of the conductive elements 250(1)-(3) have an overall width W31 and thickness T32 that are the same. In one implementation, the width W31 may be 20 mm. The conductive elements 250(1)-(3) are arranged with the same spacing T33 between the conductive elements 250 of the same sensor element 150.

An overall thickness T34 is also shown extending from an uppermost portion of the conductive element 250(1) to a bottommost portion of the insulator 308.

In some implementations the conductive elements 250 may comprise one or more of metal, electrically conductive ink, electrically conductive plastic, and so forth. For example, a conductive element 250 may comprise a copper wire that is in contact with a region printed with conductive ink.

An electrical insulator ("insulator") 308 is disposed between and underneath the conductive elements 250(1)-(3). Respective ones of the conductors 270 (not shown) are coupled to respective ones of the conductive elements 250(1)-(3). A spacing width of W32 is maintained between respective sensor elements 150.

In the implementation depicted, the apparatus 102 may be fabricated in various ways. For example, the conductive elements 250 and insulators 308 may be arranged in layers during fabrication and then joined together in a single assembly. In another example, individual layers, such as with conductive elements 250 deposited thereon, may be fabricated, and then stacked to provide the single assembly.

Figure 3B:
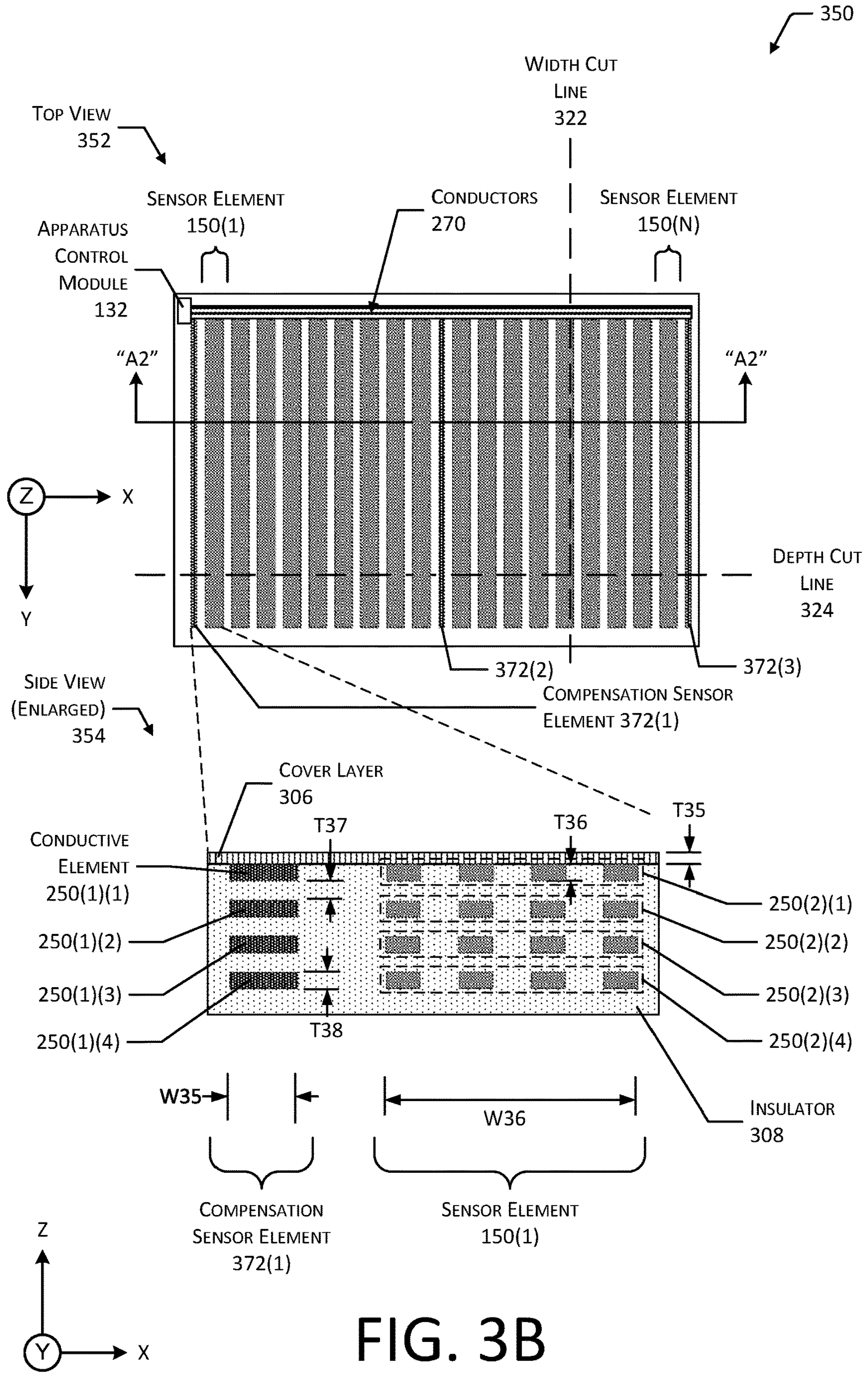
FIG. 3B illustrates a second arrangement of conductive elements of the sensor elements of the apparatus including a compensation sensor element, according to some implementations.

FIG. 3B illustrates at 350 a second arrangement of conductive elements 250 of the sensor elements 150 of the apparatus 102 including a compensation sensor element, according to some implementations. A top view 352 of an apparatus 102 and a side view 354 of an enlarged portion of the apparatus 102 are depicted. The views are shown with respect to three mutually orthogonal axes. Relative to the apparatus 102 while placed in a generally flat orientation for use, the X axis extends left-to right (width), the Y axis extends back to front (depth) and the Z axis extends bottom to top (thickness).

As shown in the top view 352, a plurality of sensor elements 150(1)-(N) are distributed in a single row of columns across the apparatus 102, forming an array. The apparatus control module 132 is located in a corner, and the conductors 270 connect the conductive elements 250 of the sensor elements 150 to the apparatus control module 132.

In some implementations, compensation sensor elements 372 may be used to determine the reference capacitance data 256 or other input to the compensation module 258. A plurality of compensation sensor elements 372(1)-(3) are shown in FIG. 3B. In this illustration, the compensation sensor elements 372 are distributed to the left, center, and right, of the array of sensor elements 150(1)-(N). In other implementations the compensation sensor element(s) 372 may be placed in other locations with respect to the apparatus 102.

As described above, the sensor elements 150 may comprise various configurations of conductive elements 250. In the implementation depicted, each conductive element 250 of the sensor elements 150 comprises an expanded conductive element 310. As mentioned above, the expanded conductive element 310 may have a conductor coverage ratio that is less than one. In other implementations, other configurations may be used.

As described above, the arrangement of the apparatus control module 132, the sensor elements 150 and their respective conductive elements 250, the compensation sensor elements 372 and their respective conductive elements 250, and the conductors 270 may facilitate cutting the apparatus 102 along one or more of a width cut line 322 or a depth cut line 324. For example, the apparatus 102 may be cut to fit within a specified shelf.

The side view 354 depicts an enlarged portion of a cross section of the apparatus 102 along line "A2-A2". In the implementation shown, the cover layer 306 such as described above is shown. The cover layer 306 has a thickness T35.

In this implementation, each sensor element 150 comprises four conductive elements 250(2)(1)-(2)(4) that are stacked vertically with respect to one another. Each conductive element 250 in this illustration is a respective expanded conductive element 310. Each of the conductive elements 250(2)(1)-(2)(4) have an overall width W36 and thickness T36 that are the same. In one implementation, the width W36 may be 20 mm. The conductive elements 250(2)(1)-(2)(4) may be arranged with the same spacing T37 between the conductive elements 250 of the same sensor element 150.

In this implementation, each compensation sensor element 372 comprises four conductive elements 250(1)(1)-(1)(4) that are stacked vertically with respect to one another. Each conductive element 250 in this illustration consists of a respective expanded conductive element 310 comprising four electrical conductors that are electrically connected. Each of the conductive elements 250(1)(1)-(1)(4) have an overall width W35 and thickness T38 that are the same. In one implementation, the width W35 may be 6 mm. The conductive elements 250(1)(1)-(1)(4) may be arranged with the same spacing T37 between the conductive elements 250. The width W35 of the compensation sensor element 372 may be less than the width W36 of the sensor element 150.

In some implementations the conductive elements 250 may comprise one or more of metal, electrically conductive ink, electrically conductive plastic, and so forth. For example, a conductive element 250 may comprise a copper wire that is in contact with a region printed with conductive ink.

An electrical insulator ("insulator") 308 is disposed between and underneath the conductive elements 250(1)-(3). Respective ones of the conductors 270 (not shown) are coupled to respective ones of the conductive elements 250(1)-(3). A spacing width of W32 is maintained between respective sensor elements 150.

In the implementation depicted, the apparatus 102 may be fabricated in various ways. For example, the conductive elements 250 and insulators 308 may be arranged in layers during fabrication and then joined together in a single assembly. In another example, individual layers, such as with conductive elements 250 deposited thereon, may be fabricated, and then stacked to provide the single assembly.

Figure 4:
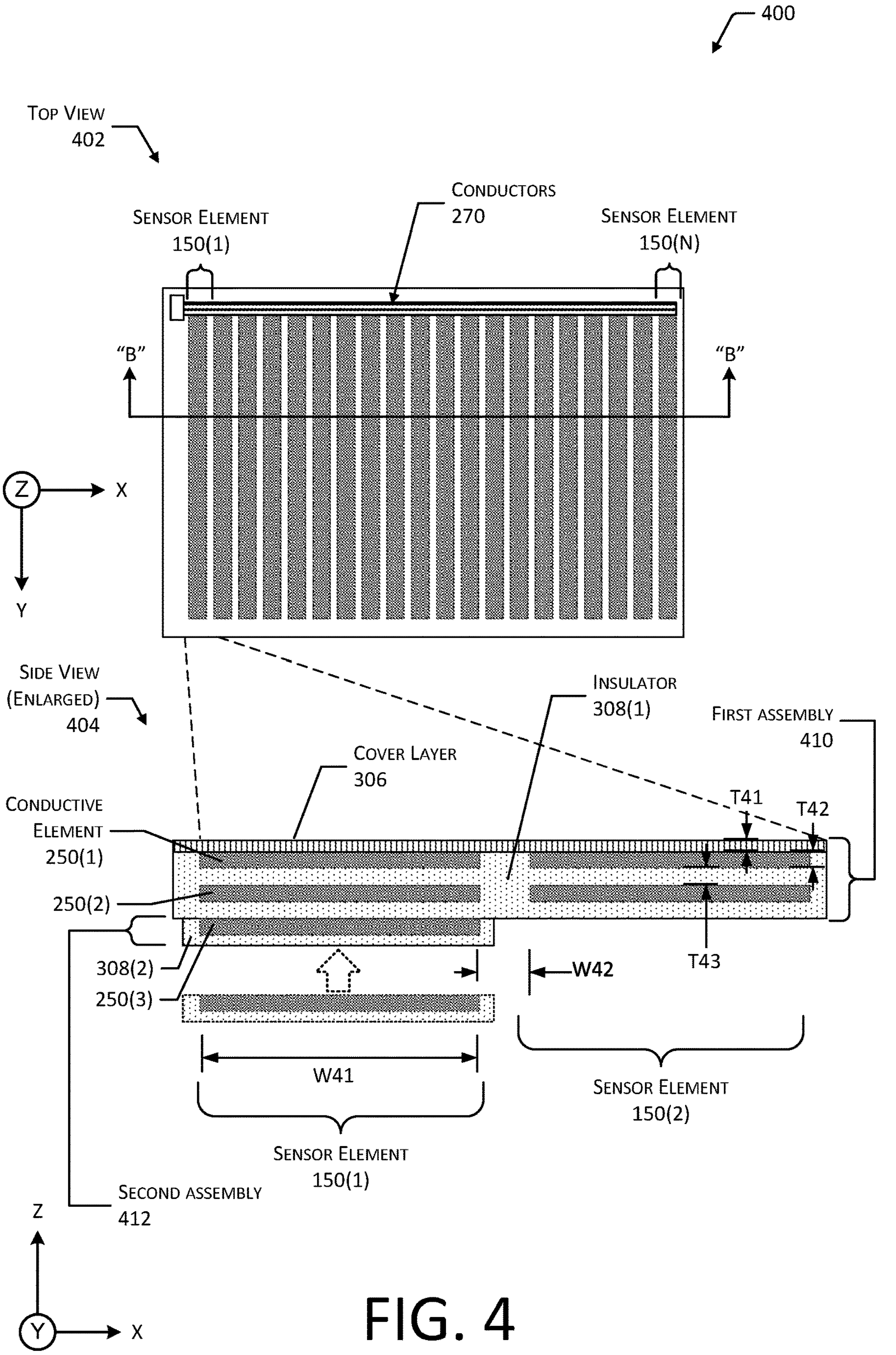
FIG. 4 illustrates a third arrangement of conductive elements of the sensor elements of the apparatus, according to some implementations.

FIG. 4 illustrates at 400 a second arrangement of conductive elements 250 of the sensor elements 150 of the apparatus 102, according to some implementations.

As shown in the top view 402, a plurality of sensor elements 150(1)-(N) are distributed in a single row of columns across the apparatus 102, forming an array. The apparatus control module 132 is located in a corner, and the conductors 270 connect the conductive elements 250 of the sensor elements 150 to the apparatus control module 132.

As described above, the arrangement of the apparatus control module 132, the sensor elements 150 and their respective conductive elements 250, and the conductors 270 may facilitate cutting the apparatus 102.

The side view 404 depicts an enlarged portion of a cross section of the apparatus 102 along line "B-B". In the implementation shown, a cover layer 306 is provided. The cover layer 306 may comprise a dielectric material having a thickness of T41. In some implementations, the cover layer 306 may comprise a portion of the insulator 308. The sensor elements 150 are arranged beneath the cover layer 306.

In this implementation, some sensor elements 150, such as sensor element 150(1), comprises three conductive elements 250(1)-(3) that are stacked vertically with respect to one another.

In comparison, some sensor elements 150, such as sensor element 150(2), comprise only two conductive elements 250(1)-(2) that are stacked vertically with respect to one another.

Each of the conductive elements 250(1)-(3) have the same width W41 and thickness T42. In one implementation, the width W41 may be 20 mm. The conductive elements 250(1)-(3) are arranged with the same spacing T43 between the conductive elements 250 of the same sensor element 150.

An insulator 308 is disposed between the conductive elements 250(1)-(3). Respective ones of the conductors 270 (not shown) are coupled to respective ones of the conductive elements 250(1)-(3). A spacing width of W42 is maintained between respective sensor elements 150.

In this implementation the apparatus 102 may comprise a first assembly 410 and a second assembly 412. The first assembly 410 may comprise the cover layer 306, insulator 308(1), the first conductive element 250(1), and the second conductive element 250(2) for a plurality of sensor elements 150. The second assembly 412 may comprise a third conductive element 250(3) and associated insulator 308(2).

The first assembly 410 may be fabricated separately from the second assembly 412. One or more instances of the second assembly 412 may then be applied to the first assembly 410. In this fashion, some sensor elements 150 may comprise three conductive elements 250(1)-(3), while other sensor elements 150 comprise two conductive elements 250(1)-(2).

As described above, the conductive elements 250 are electrically coupled to the apparatus control module 132 via the conductors 270 (not shown in this figure). In some implementations, the first assembly 410 may comprise the conductors 270. One of the conductors 270 may terminate in a contact pad that is present at a surface of the first assembly 410. For example, the contact pad may be located on the underside of the first assembly 410. When the second assembly 412 is joined to the first assembly 410, the contact pad may provide an electrically conductive pathway from the third conductive element 250(3) to the conductors 270 in the first assembly 410. For example, the contact may come into physical contact with an exposed portion of the third conductive element 250(3).

In some implementations the second assembly 412 may be encapsulated within an insulator 308(2). A portion of the third conductive element 250(3) or an electrically conductive pathway thereto, may be configured to come into contact with the contact pad on the first assembly 410 when joined.

Figure 5:
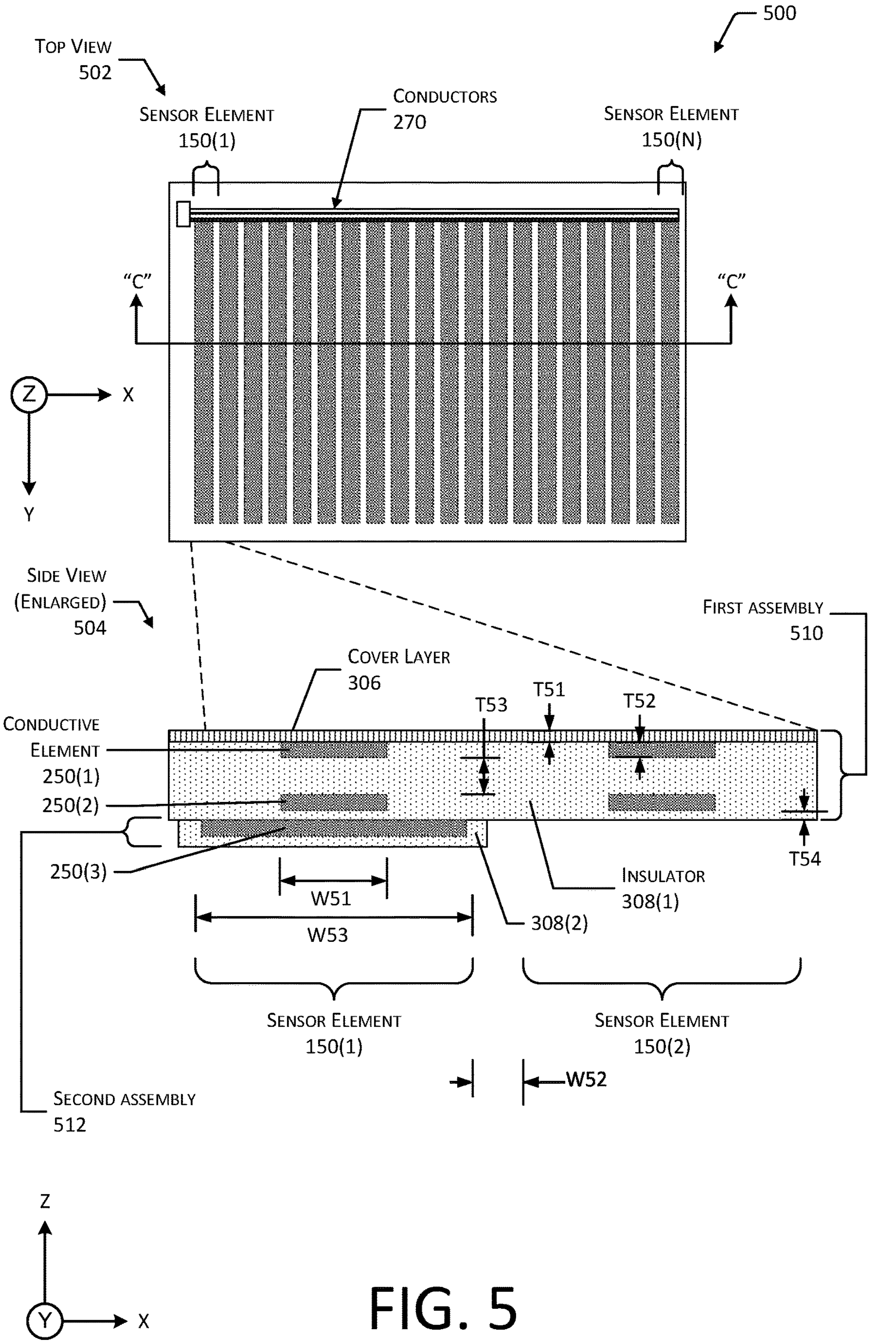
FIG. 5 illustrates a fourth arrangement of conductive elements of the sensor elements of the apparatus, according to some implementations.

FIG. 5 illustrates at 500 a third arrangement of conductive elements 250 of the sensor elements 150 of the apparatus 102, according to some implementations.

As shown in the top view 502, a plurality of sensor elements 150(1)-(N) are distributed in a single row of columns across the apparatus 102, forming an array. The apparatus control module 132 is located in a corner, and the conductors 270 connect the conductive elements 250 of the sensor elements 150 to the apparatus control module 132.

As described above, the arrangement of the apparatus control module 132, the sensor elements 150 and their respective conductive elements 250, and the conductors 270 may facilitate cutting the apparatus 102.

The side view 504 depicts an enlarged portion of a cross section of the apparatus 102 along line "C-C". In the implementation shown, a cover layer 306 is provided. The cover layer 306 has a thickness T51. The sensor elements 150 are arranged beneath the cover layer 306.

In this implementation, some sensor elements 150, such as sensor element 150(1), comprises three conductive elements 250(1)-(3) that are stacked vertically with respect to one another.

In comparison, some sensor elements 150, such as sensor element 150(2), comprise only two conductive elements 250(1)-(2) that are stacked vertically with respect to one another.

The conductive element 250(3) has a width of W53 and a thickness of T52. In one implementation, the width W53 may be 20 mm. In comparison, the conductive elements 250(1) and 250(2) have a width of W51, where W51 is less than W53.

In one implementation, the conductive elements 250(2)-250(3) may have a thickness of T52. In other implementations, different conductive elements 250 may have different thicknesses.

The first conductive element 250(1) and the second conductive element 250(2) are separated by thickness T53. For example, T53 may be between 1 and 3 millimeters (mm). In comparison, the conductive elements 250(2) and 250(3) are separated by thickness T54, where T54 is less than T53. For example, T54 may be less than 1 mm.

An insulator 308 is disposed between the conductive elements 250(1)-(3). Respective ones of the conductors 270 (not shown) are coupled to respective ones of the conductive elements 250(1)-(3). A spacing width of W52 is maintained between respective sensor elements 150.

In this implementation, the apparatus 102 may comprise a first assembly 510 and a second assembly 512, as described above. For example, the first assembly 510 may comprise the cover layer 306, insulator 308(1), the first conductive element 250(1), and the second conductive element 250(2) for a plurality of sensor elements 150. The second assembly 512 may comprise a third conductive element 250(3) and associated insulator 308(2).

The first assembly 510 may be fabricated separately from the second assembly 512. One or more instances of the second assembly 512 may then be applied to the first assembly 510. In this fashion, some sensor elements 150 may comprise three conductive elements 250(1)-(3), while other sensor elements 150 comprise two conductive elements 250(1)-(2).

As described above, the conductive elements 250 are electrically coupled to the apparatus control module 132 via the conductors 270 (not shown in this figure). In some implementations, the first assembly 510 may comprise the conductors 270. One of the conductors 270 may terminate in a contact pad that is present at a surface of the first assembly 510. For example, the contact pad may be located on the underside of the first assembly 510. When the second assembly 512 is joined to the first assembly 510, the contact pad may provide an electrically conductive pathway from the third conductive element 250(3) to the conductors 270 in the first assembly 510. For example, the contact may come into physical contact with an exposed portion of the third conductive element 250(3).

In some implementations the second assembly 512 may be encapsulated within an insulator 308(2). A portion of the third conductive element 250(3) or an electrically conductive pathway thereto, may be configured to come into contact with the contact pad on the first assembly 510 when joined.

Figure 6:
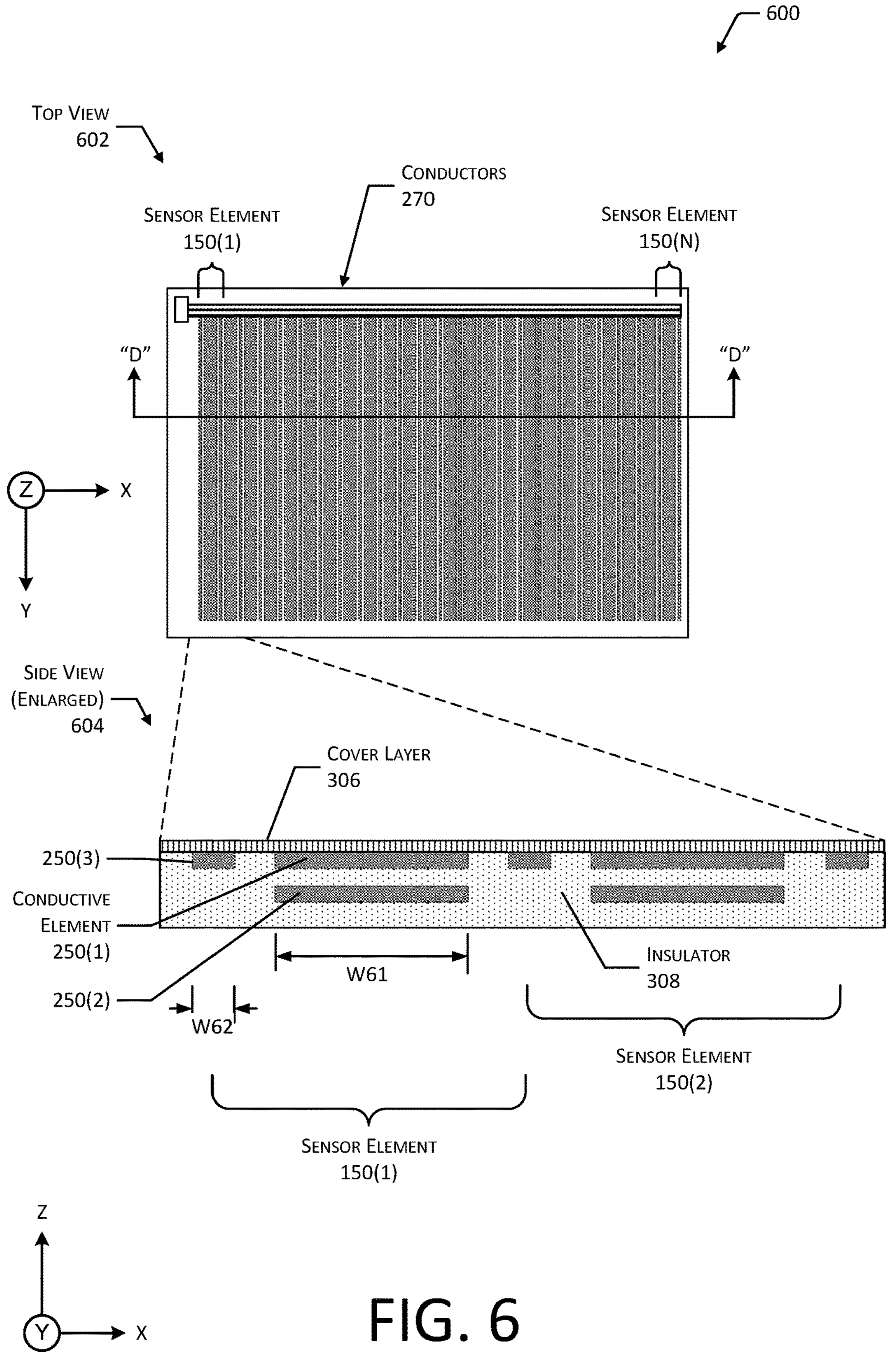
FIG. 6 illustrates a fifth arrangement of conductive elements of the sensor elements of the apparatus, according to some implementations.

FIG. 6 illustrates at 600 a fourth arrangement of conductive elements 250 of the sensor elements 150 of the apparatus 102, according to some implementations.

As shown in the top view 602, a plurality of sensor elements 150(1)-(N) are distributed in a single row of columns across the apparatus 102, forming an array. The apparatus control module 132 is located in a corner, and the conductors 270 connect the conductive elements 250 of the sensor elements 150 to the apparatus control module 132.

As described above, the arrangement of the apparatus control module 132, the sensor elements 150 and their respective conductive elements 250, and the conductors 270 may facilitate cutting the apparatus 102.

The side view 604 depicts an enlarged portion of a cross section of the apparatus 102 along line "D-D". In the implementation shown, a cover layer 306 is provided. The sensor elements 150 are arranged beneath the cover layer 306. In some implementations, the cover layer 306 may comprise a portion of the insulator 308.

In this implementation, each sensor element 150 comprises a first conductive element 250(1) and a second conductive elements 250(2) stacked vertically with respect to one another. The third conductive element 250(3) is coplanar with the first conductive element 250(1). For example, the first conductive element 250(1) and the third conductive element 250(3) may both be arranged just beneath the cover layer 306, may be deposited on the same substrate, and so forth.

The conductive elements 250(1) and 250(2) have a width of W61. In one implementation, the width W61 may be 20 mm. In comparison, the conductive element 250(3) has a width of W62, where W62 is less than W61.

An insulator 308 is disposed between the conductive elements 250(1)-(3). Respective ones of the conductors 270 (not shown) are coupled to respective ones of the conductive elements 250(1)-(3).

In one implementation, during operation a sensor element 150 may comprise the first conductive element 250(1), the second conductive element 250(2), and one or more of the third conductive elements 250(3) that are adjacent to the first conductive element 250(1).

Figure 7:
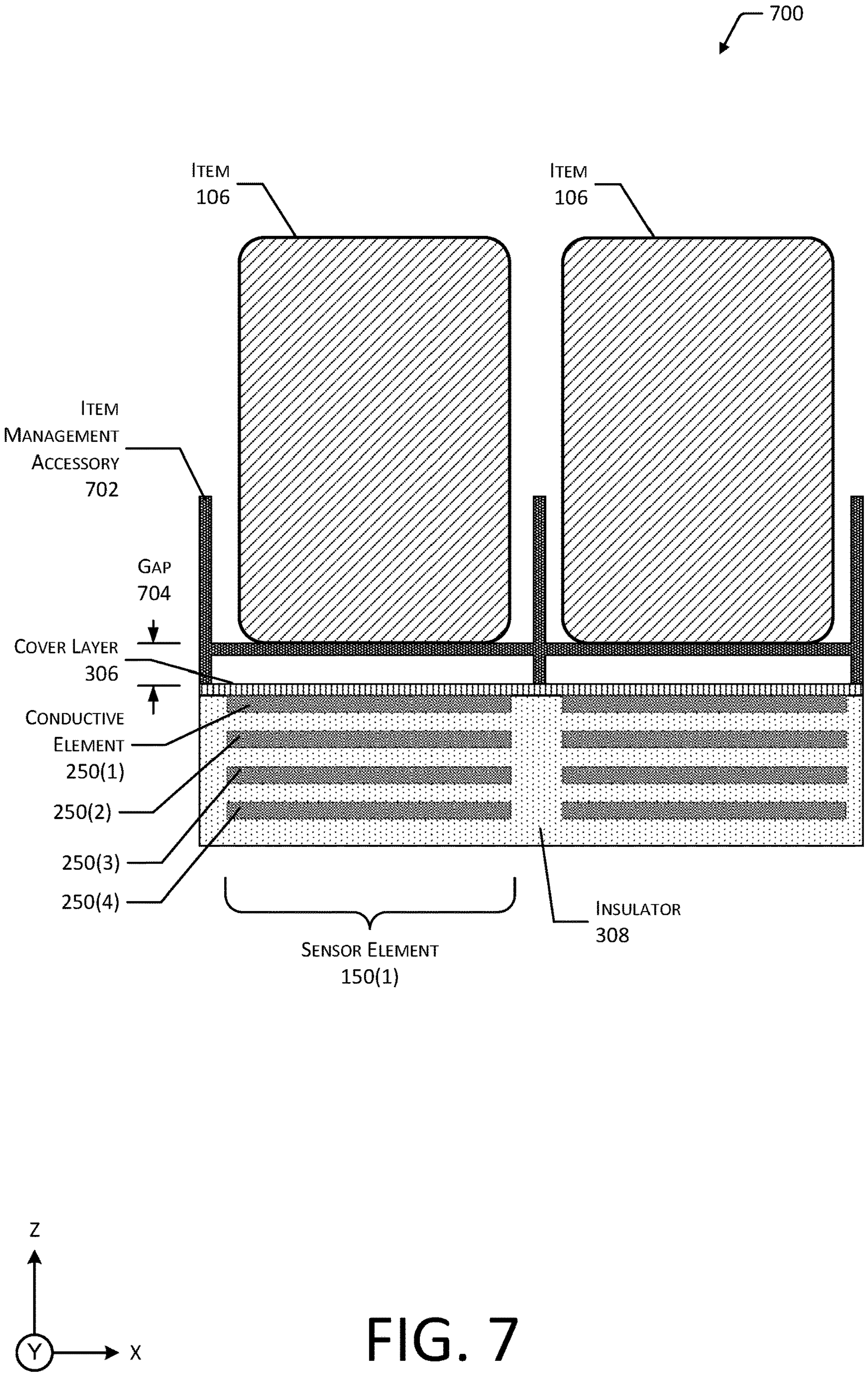
FIG. 7 illustrates operation of the apparatus with an item management accessory, according to some implementations.

FIG. 7 illustrates at 700 operation of the apparatus 102 with an item management accessory 702, according to some implementations. The various configurations of conductive elements 250(1)-(4) described with regard to FIGS. 3A-6 may be used in conjunction with the cover layer 306. As mentioned above, respective conductive elements 250 may comprise expanded conductive elements 310. In some implementations, compensation sensor elements 372 (not shown), may be included.

An item management accessory 702 may provide a gap 704 between an upper surface of the cover layer 306 and the items 106 being stowed. The item management accessory 702 may be designed to maintain an orderly arrangement of items 106, providing physical dividers or walls between lanes 104. In some implementations the item management accessory 702 may include pushers or other mechanisms designed to move items 106 towards a front of the inventory location. In another implementation the item management accessory 702 may provide airflow to facilitate temperature or humidity control of the items 106.

The operation of the sensor elements 150 by the apparatus control module 132 in the self-capacitance mode allows for the items 106 to be detected even with the presence of the gap 704. In some implementations, the gap 704 may be at least 0.1 mm. For example, the gap 704 may be between 0.1 mm and 8 mm. In some implementations, the item management accessory 702 may be used to provide the gap 704 to improve performance of the system 100, as described with regard to FIG. 8.

Figure 8:
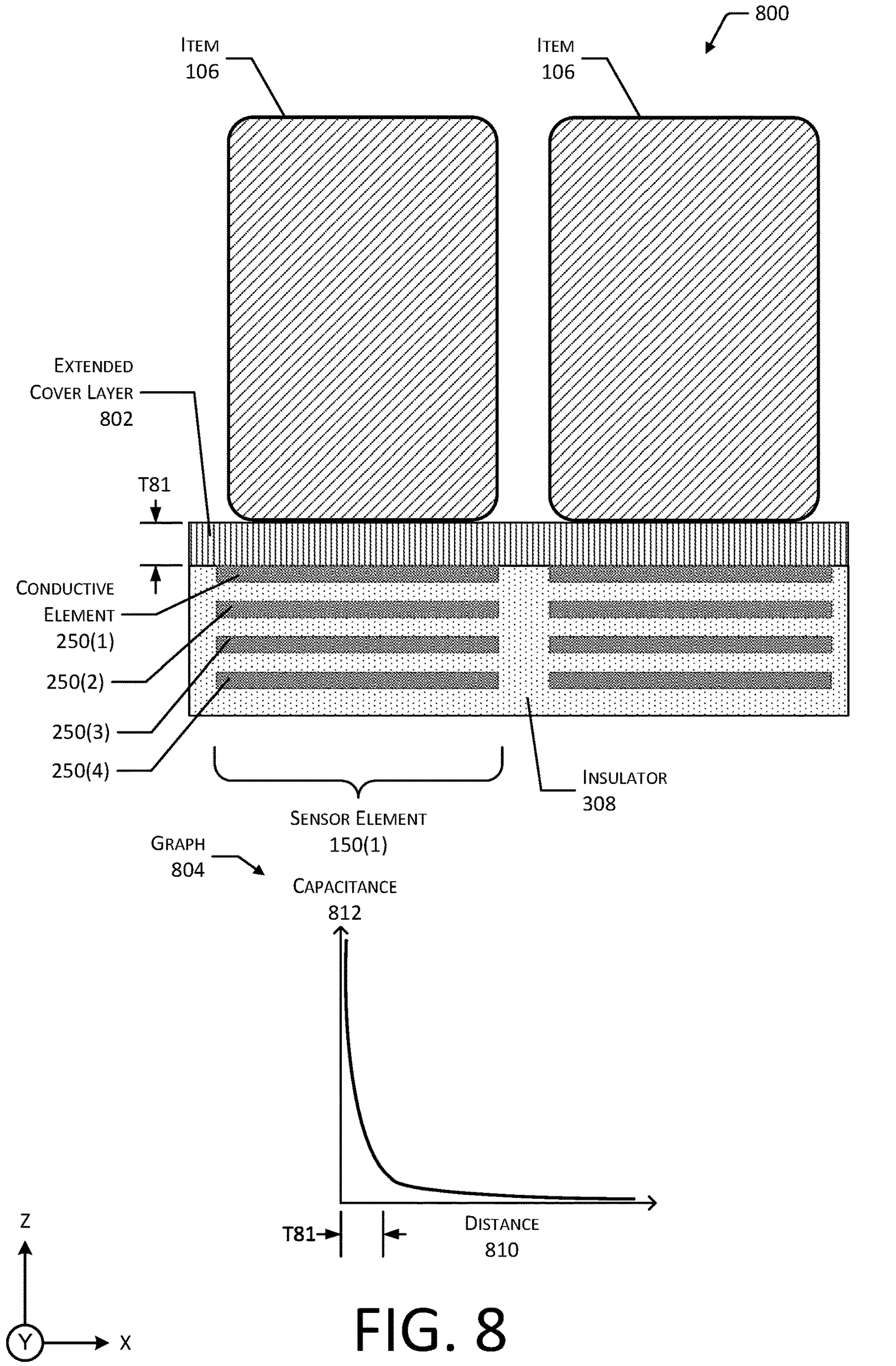
FIG. 8 illustrates the apparatus with an extended cover layer, according to some implementations.

FIG. 8 illustrates at 800 the apparatus 102 with an extended cover layer 802, according to some implementations. The various configurations of conductive elements 250(1)-(4) described with regard to FIGS. 3A-6 may be used in conjunction with the extended cover layer 802. As mentioned above, respective conductive elements 250 may comprise expanded conductive elements 310. In some implementations, compensation sensor elements 372 (not shown), may be included.

The extended cover layer 802 may comprise a dielectric material, such as non-conductive plastic, ceramic, and so forth. The sensor elements 150 are arranged beneath the extended cover layer 802. In some implementations, the extended cover layer 802 may be placed over the cover layer 306.

The extended cover layer 802 has a thickness T81. In some implementations, the thickness T81 may be at least 0.1 mm. For example, the thickness T81 may be between 0.1 mm and 8 mm. For example, T81 may be at least 3 mm. This increases the distance between the conductive elements 250 and the item 106 during use, similar to the gap 704 provided by the item management accessory 702. A useful result of increasing the thickness T81 is improved resistance to adverse effects caused by the presence of fluids, such as water, on the capacitance measurements. For example, a thickness T81 of 5 mm provides reliable operation in the presence of large droplets and small pools of water.

A graph 804 shows the relationship between distance 810 and capacitance 812. Capacitance 812 varies with distance 810 in a 1/x hyperbolic relationship. The thickness T81 is shown with respect to the graph 804. By introducing the spacing produced by thickness T81 of the extended cover layer 802, or the gap 704 of the item management accessory 702, the system will be assessing capacitance values that exhibit more of a linear relationship, and less of an exponential relationship. Colloquially, the portion of the curve being assessed is "less steep". This provides a substantial advantage during operation, particularly in situations where the items 106 have non-uniform lower portions or may not sit flat. For example, some plastic beverage bottles have an arrangement of protrusions, providing a non-uniform surface to the apparatus 102. In another example, items 106 may not sit completely vertically, either due to irregularities in their containers, displacement during pick or place operations, or other factors.

As a result of the spacing introduced by the extended cover layer 802 or the item management accessory 702, the irregularities of the items 106 result in less of a capacitance change than if the items 106 were closer to the conductive elements 250. As a result, during operation the resulting capacitance data 116 contains less noise, and results in simpler data processing to determine the interaction data 128.

Figure 9:
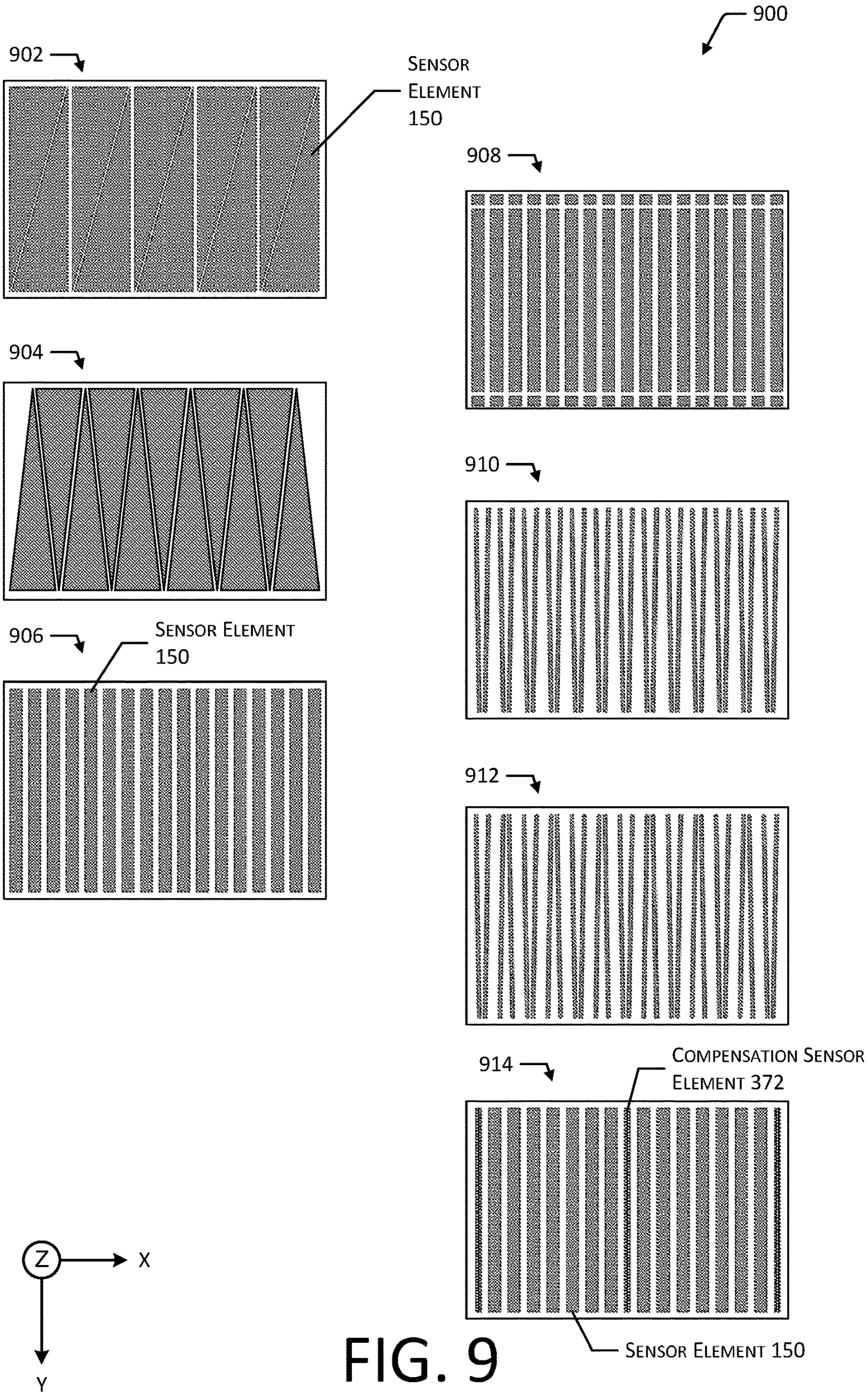
FIG. 9 illustrates several layouts of sensor elements of the apparatus, according to some implementations.

FIG. 9 illustrates at 900 several layouts of sensor elements 150 of the apparatus 102, according to some implementations.

A first layout 902 depicts the sensor elements 150 arranged in pairs, with each pair comprising a first triangular sensor element 150 and a second triangular sensor element 150. Each of the triangular sensor elements 150 has three sides forming the triangular shape. Each of the triangular sensor elements 150 may be a right triangle. The longest side of each triangle, or hypotenuse, may be arranged to be adjacent to the longest side of the other triangle in the pair. When arranged in this manner, an overall shape of the pair of triangular sensor elements 150 is generally square or rectangular. With regard to the first layout 902, a long axis through the pair of triangular sensor elements 150 extends from a front to a back of the apparatus 102. Operation of the first layout 902 is discussed in more detail with regard to FIG. 10.

A second layout 904 depicts an arrangement in which the sensor elements 150 are triangular sensor elements 150 arranged adjacent to one another. In the arrangement depicted, the triangles are isosceles triangles. In other implementations, other types of triangles or other geometric shapes may be used.

A third layout 906 depicts an arrangement in which the sensor elements 150 comprise strips or rectangles having a long axis that extends from the front to the back of the apparatus 102 or other inventory location. In some implementations, the width of the strips may be configured to be less than or equal to the width of a lane 104.

A fourth layout 908 depicts an arrangement in which the sensor elements 150 comprise strips or rectangles having a long axis that extends from the front to the back of the apparatus 102 or other inventory location, with additional sensor elements 150 arranged at one or both ends of each strip. Operation of this layout is described in more detail with regard to FIG. 23.

A fifth layout 910 depicts the sensor elements 150 arranged in pairs, with each pair comprising a first sensor element 150 and a second sensor element 150 arranged in a "V" shape. In this layout, the apex of each "V" is on the same side of the apparatus 102.

A sixth layout 912 depicts the sensor elements 150 arranged in pairs, with each pair comprising a first sensor element 150 and a second sensor element 150 arranged in a "V" shape. In this layout, the apex of each "V" is on an opposite side of the apparatus 102 relative to an adjacent pair of sensor elements 150.

A seventh layout 914 depicts an arrangement in which the sensor elements 150 comprise strips or rectangles having a long axis that extends from the front to the back of the apparatus 102 or other inventory location, and one or more compensation sensor elements 372 are present. In some implementations, the width of the strips of the sensor elements 150 may be configured to be less than or equal to the width of a lane 104.

In the implementation shown, three compensation sensor elements 372(1)-(3) are present. The compensation sensor elements 372 are distributed to the left, center, and right, of the array of sensor elements 150(1)-(N). In other implementations the compensation sensor element(s) 372 may be placed in other locations with respect to the apparatus 102.

Figure 10:
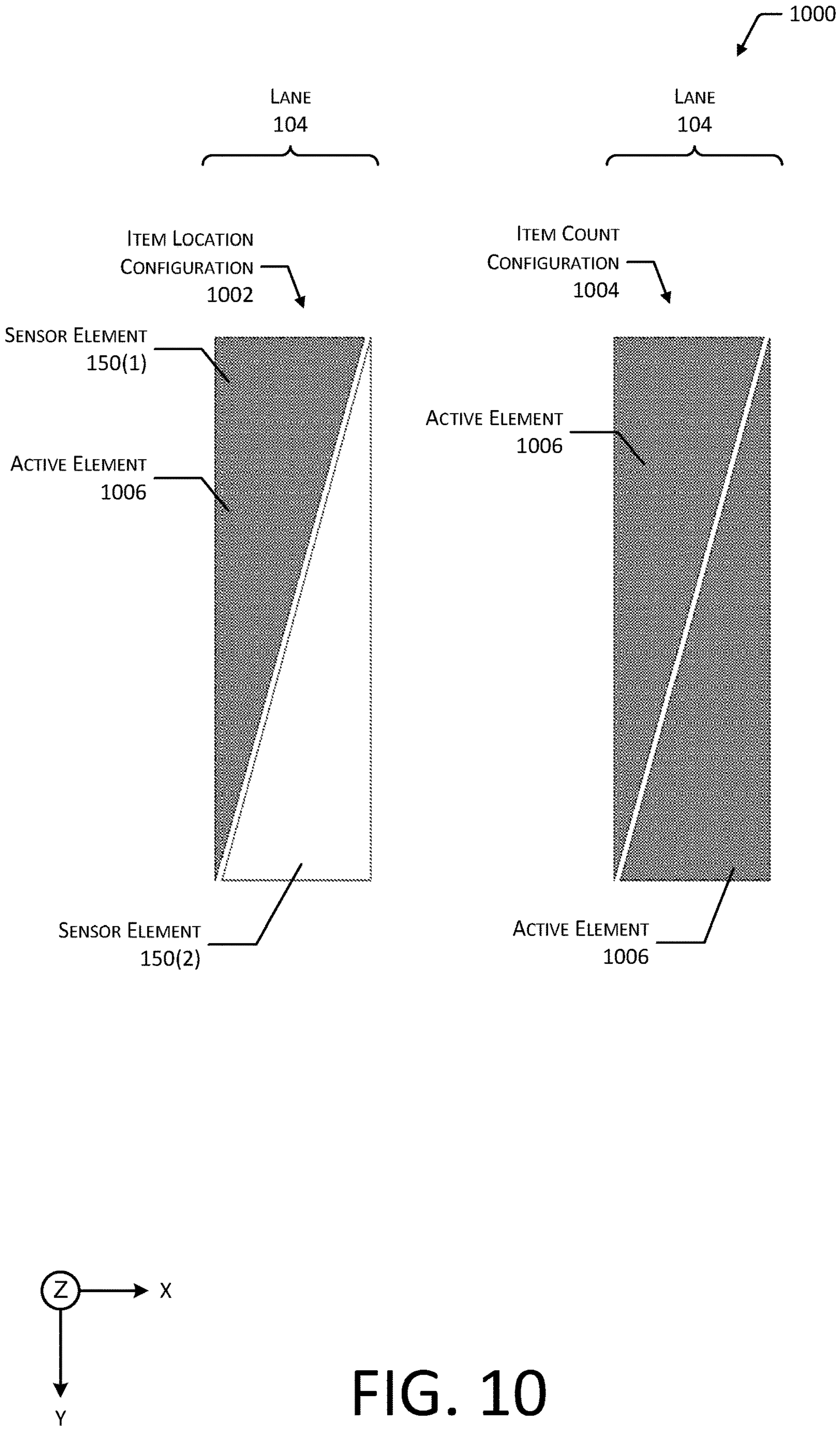
FIG. 10 illustrates operation of triangular sensor elements of the apparatus, according to some implementations.

In some implementations, layouts 902, 904, 910, and 912 may be operated as described with regard to FIG. 10.

In other implementations, other layouts may be used. For example, a grid layout may be used, comprising sensor elements 150 arranged in rows and columns.

FIG. 10 illustrates at 1000 operation of triangular sensor elements 150 of the apparatus 102, according to some implementations. As described above with regard to FIG. 9, pairs of sensor elements 150 may be operated to determine additional information about the items 106 proximate to the apparatus 102. For ease of discussion with regard to this figure, it is assumed that each lane 104 includes a single pair of sensor elements 150(1)-(2). It is understood that in other implementations, other arrangements with respect to lanes 104 may be used.

An item location configuration 1002 is depicted in which sensor element 150(1) is an active element 1006. An active element 1006 may comprise one or more sensor elements 150 that are connected via the switch module 212 to the capacitive sensor module 206 to determine capacitance data 116 at the same time. For example, the apparatus control module 132 is used to determine capacitance data 116 associated with the sensor element 150(1). Due to the change in area of the sensor element 150(1) with respect to the depth of the lane 104, a change in the capacitance data 116 may be associated with a depth along the sensor element 150(1). In some implementations, the apparatus control module 132 may determine individual capacitance data 116 for each of the sensor elements 150(1)-(2), and use the pair of capacitance data 116 to determine the location.

An item count configuration 1004 is shown in which both sensor elements 150(1)-(2) are operated simultaneously as active elements 1006. For example, the switch module 212 may connect the first conductive element 250(1) (1) of the first sensor element 150(1) and the first conductive element 250(2)(1) of the second sensor element 150(2) at the same time to the signal source of the capacitive sensor module 206.

Figure 11:
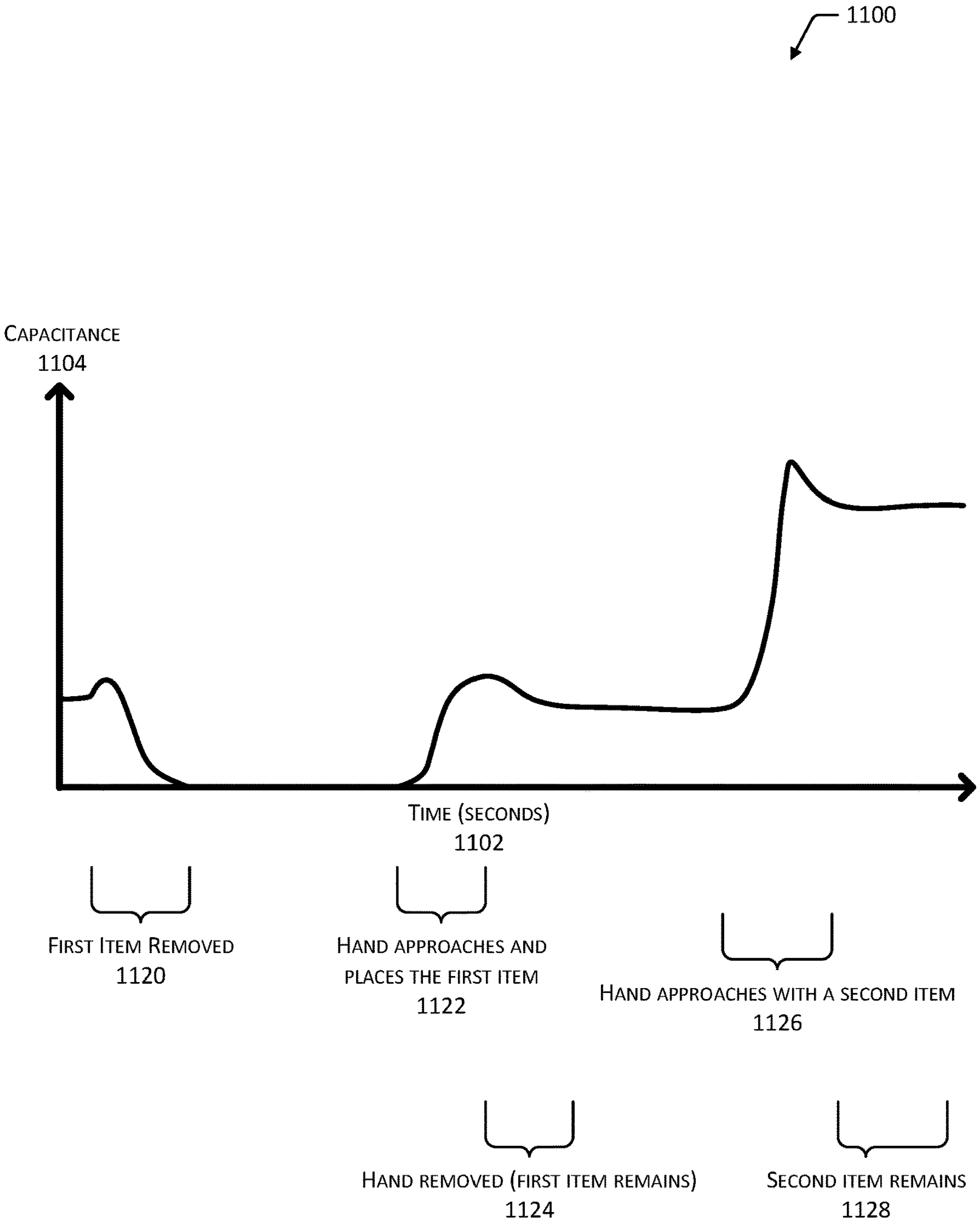
FIG. 11 is a graph of capacitance over time depicting various interactions, according to some implementations.

FIG. 11 is a graph 1100 of capacitance over time depicting various interactions as determined by the apparatus 102, according to some implementations. These interactions produce well defined changes in capacitance that may be used to determine one or more attributes of the interaction data 128.

A horizontal axis depicts time 1102 in seconds, increasing from left to right. A vertical axis depicts capacitance 1104 as determined by the apparatus control module 132.

At time 0, a first item 106(1) is present at the apparatus 102 and is detected.

At 1120 the first item 106(1) is removed. The momentary increase in capacitance may be due to the additional capacitance of the user 108, such as their hand, while the overall decrease in capacitance is due to the removal of the item 106(1). The system 100 may use this information to determine the presence of a user 108.

At 1122 the user 108 is holding the first item 106(1) approaches the apparatus 102 and places the first item 106(1) at the apparatus 102, resulting in an increase in capacitance.

At 1124 the user 108 removes their hand, leaving the first item 106(1) at the apparatus 102, resulting in a nonzero capacitance.

At 1126 the user 108 is holding a second item 106(2) and approaches the apparatus 102 and places the second item 106(2) at the apparatus 102. At 1128 the user 108 removes their hand, leaving the second item 106(2) and the first time 106(1) at the apparatus 102, resulting in an increase in the capacitance.

Figure 12:
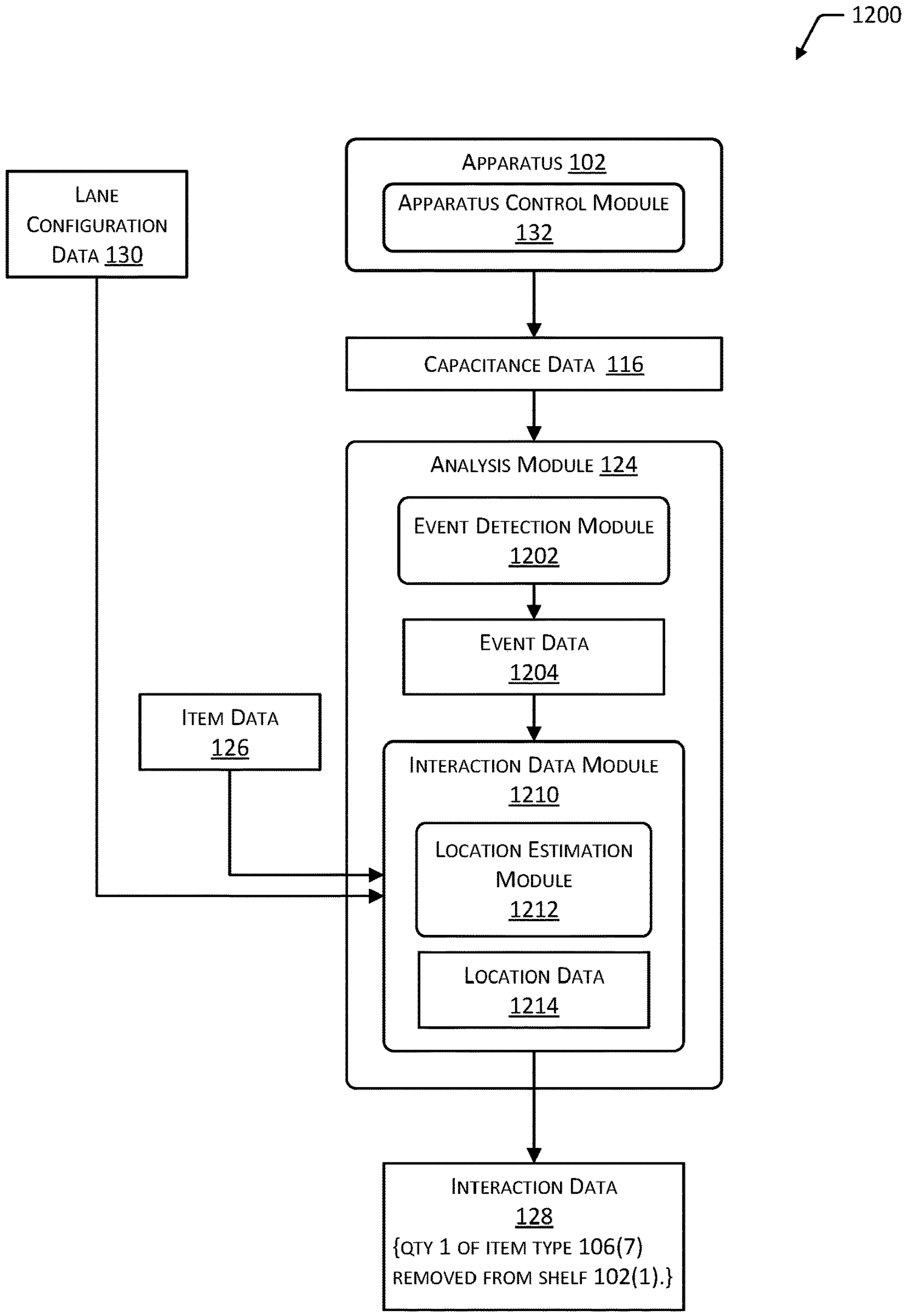
FIG. 12 depicts a block diagram of a first implementation to determine interaction data.

FIG. 12 depicts a block diagram 1200 of a first implementation to determine interaction data 128. The apparatus 102 includes the apparatus control module 132 that provides as output the capacitance data 116. The capacitance data 116 may be sent to the analysis module 124 using the communication interface 260. For example, the apparatus control module 132 may use a wireless communication interface or wired communication interface to send the capacitance data 116 to the analysis module 124. Language indicative of a particular time may indicate a particular instant in time or a particular interval of time that begins or ends at the designated particular time.

The analysis module 124 may comprise instructions that execute on one or more computing devices. For example, the one or more computing devices may be located in the same physical location as the apparatus 102, or at a remote location such as at a cloud data center. The analysis module 124 may include an event detection module 1202. The event detection model 1202 may accept as input one or more of capacitance data 116, item data 126, or other data 114. The event detection module 1202 is configured to generate event data 1204. The event data 1204 may comprise information indicative of a change deemed to be significant that is associated with an inventory location or portion thereof. For example, the event data 1204 may be indicative of a determination by a set of one or more sensor elements 150 of proximity of an object, such as an item 106 or user 108. In another example, the event data 1204 may comprise an indication that a weight change has exceeded a threshold value. In yet another example, the event data 1204 may indicate that motion between a plurality of images has been detected that exceeds a threshold value. The event detection module 1202 may utilize one or more filter functions, comparison functions, and so forth, to determine the event data 1204. For example, the event data 1204 may result from a determination that the capacitance data 116 and other data 114 have each experienced changes that exceed a threshold value. The event detection module 1202 may utilize various rules or conditions to determine the occurrence of an event and subsequent generation of event data 1204.

Figure 17:
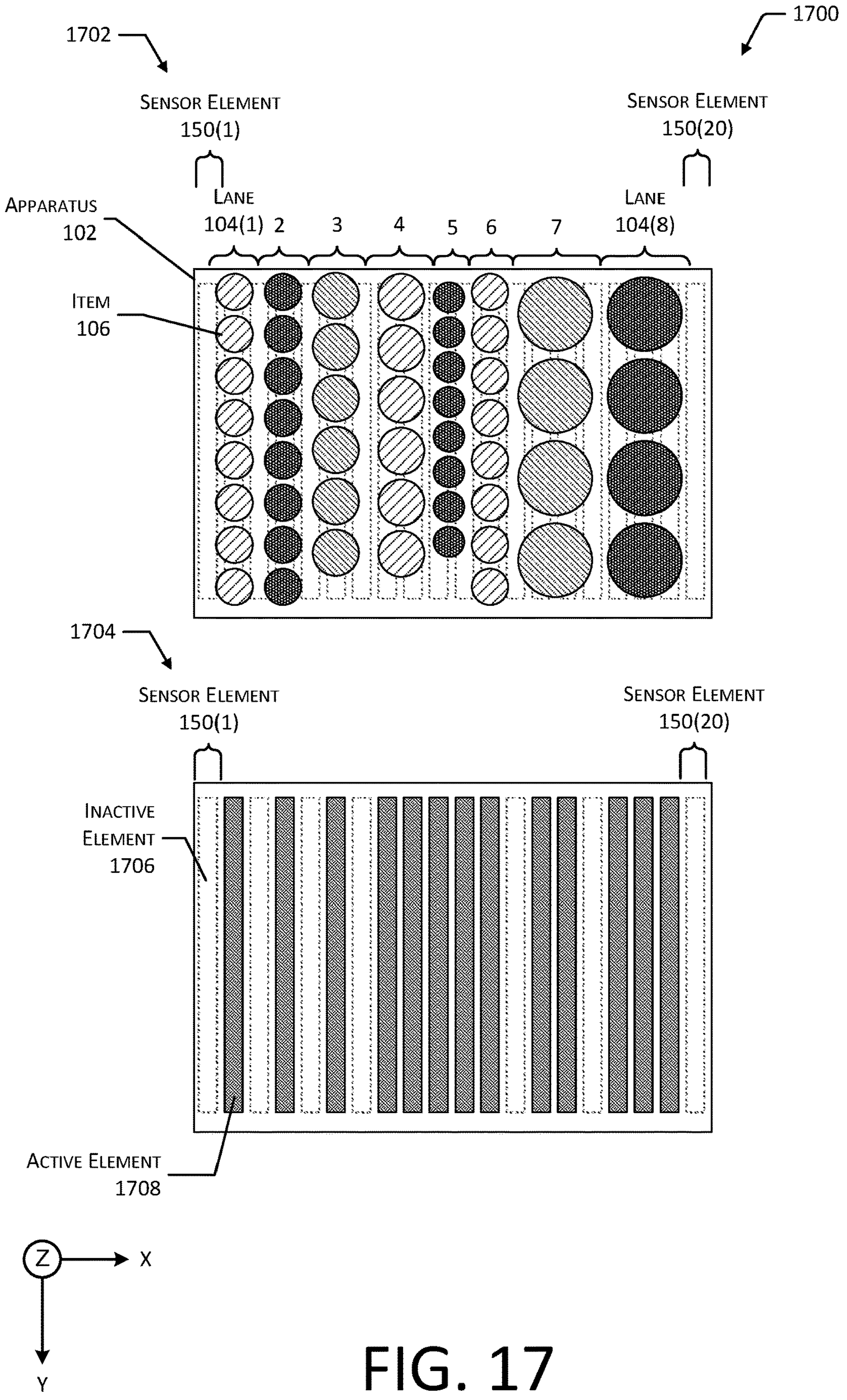
FIG. 17 depicts active and inactive sensor elements associated with respective lanes, according to some implementations.

During operation, the analysis module 124 may sum the capacitance data 116 acquired from two or more sensor elements 150. For example, first capacitance data 116(1) acquired using sensor element 150(14) and second capacitance data 116(2) acquired using sensor element 150(15) may be combined via summing, averaging, or other techniques to determine information about lane 104(7), such as shown in FIG. 17.

The analysis module 124 may accept as input event data 1204, capacitance data 116, or other data 114 and perform one or more data processing functions. The data processing functions may include, but are not limited to, filtering, noise reduction, signal recovery, determination of a moving average, statistical analysis, and so forth. In one implementation, the event data 1204 may be utilized to apply particular data processing functions to specific data or portions thereof. For example, the event data 1204 may indicate presence of an object based on a variation in the capacitance data 116. The event data 1204 may be associated with a particular time. The analysis module 124 may access one or more of a set of capacitance data 116 or the other data 114 that was obtained before and after the particular time. The analysis module 124 may apply one or more noise filters or other data processing functions to determine baseline data before the particular time of the event data 1204 and after the particular time.

The analysis module 124 may also accept as input other data 114, such as input from other sensor(s) 112 a weight sensor, light sensor, accelerometer, hygrometer, radio frequency (RF) receiver, and so forth. The analysis module 124 may process the other data 114 to determine the interaction data 128. For example, image data may be processed to generate information indicative of changes between images, object recognition data, and so forth. Processing of one or more of the image data or portions thereof may be performed by implementing, at least in part, one or more of the following tools or techniques. In one implementation, processing of the image data may be performed, at least in part, using one or more tools available in the OpenCV library as developed by Intel Corporation of Santa Clara, California, USA; Willow Garage of Menlo Park, California, USA; and Itseez of Nizhny Novgorod, Russia. In another implementation, functions available in the OKAO machine vision library as promulgated by Omron Corporation of Kyoto, Japan, may be used to process the image data. In still another implementation, functions such as those in the Machine Vision Toolbox for Matlab (MVTB) available using MATLAB as developed by MathWorks, Inc. of Natick, Massachusetts, USA, may be utilized.

An interaction data module 1210 may be configured to use as input one or more of the event data 1204, item data 126, capacitance data 116, other data 114, and so forth, to generate the interaction data 128. The interaction data module 1210 may include a location estimation module 1212. The location estimation module 1212 may be configured to use one or more of the lane configuration data 130, the event data 1204, the capacitance data 116, or the other data 114 to determine location data 1214 associated with an interaction.

The location estimation module 1212 may also use the item data 126 to determine the location data 1214. For example, the item data 126 associated with a particular type of item 106 may be retrieved, providing information such as a width and depth, measured capacitance of a representative sample of the type of item 106, and so forth. The location estimation module 1212 may use information such as the width and depth to determine an area that item 106 is expected to cover. Based on this information, the location estimation module 1212 may avoid generating location data 1214 that places the item 106 in the middle of a divider or some other unlikely location. For example, an item area associated with the item 106 may be determined by multiplying the width and depth indicated by the item data 126. An inventory area designated for stowage of items 106 is determined that is associated with the inventory location. For example, lane 104(1) may be indicated in physical layout data as having a particular location in the facility and a particular width and depth. The location estimation module 1212 may determine location data 1214 indicative of a center of the item area for the type of item 106 such that the item area is arranged within the inventory area. Continuing the example, the location estimation module 1212 may be configured to avoid generating location data 1214 that would place an item halfway off the apparatus 102, or spanning a divider between lanes 104.

The location data 1214 may provide information indicative of a particular location with regard to an inventory location. For example, the location data 1214 may indicate a particular lane 104, portion of a lane 104, coordinates of the point or area on the apparatus 102, and so forth. The interaction may comprise movement, presence, pick, place, and so forth, of an object or an item 106.

In one implementation, the event data 1204 may specify a particular lane 104 at which an event took place, whether the type of event was a pick or a place, and a change in capacitance before and after the event. In this implementation, the lane 104 may be used as the location data 1214.

In another implementation, the event data 1204 may provide information associated with or sets of one or more sensor elements 150. The lane configuration data 130 may then be used to determine which lanes 104 are associated with the sets of sensor elements 150.

In one implementation, the location estimation module 1212 may use the capacitance data 116 obtained from one or more sets of sensor elements 150 on the apparatus 102 to determine that there was a change made to the items 106 at a given lane 104. For example, the estimated location may correspond to an area of a set of sensor elements 150 used to determine the capacitance data 116. In another example, the capacitance data 116 from a plurality of sensor elements 150 in a known configuration, such as depicted in layouts 902, 904, 910, or 912, may be used to generate the location data 1214. The interaction data module 1210 may access the item data 126 to determine the type of item 106 stored at the lane 104(1), and other characteristics about that type of item 106 such as a per item weight.

The interaction data module 1210 may use other modules (not shown) to determine a quantity. For example, weight data from weight sensors at the apparatus 102 may be used to determine a weight change value, and this weight change value may be compared with the per item weight to determine a quantity of items 106 that have changed. A sign of the weight change may be used to indicate addition or removal of an item 106. For example, a positive weight change value may indicate an increase in weight indicative of placement of an item 106 at an inventory location, while a negative weight change value may indicate a decrease in the weight indicative of pick of an item 106 from the inventory location. The interaction data module 1210 may thus generate interaction data 128. For example, the interaction data 128 may indicate a quantity and type of item 106 that was removed from a particular inventory location.

Figure 13:
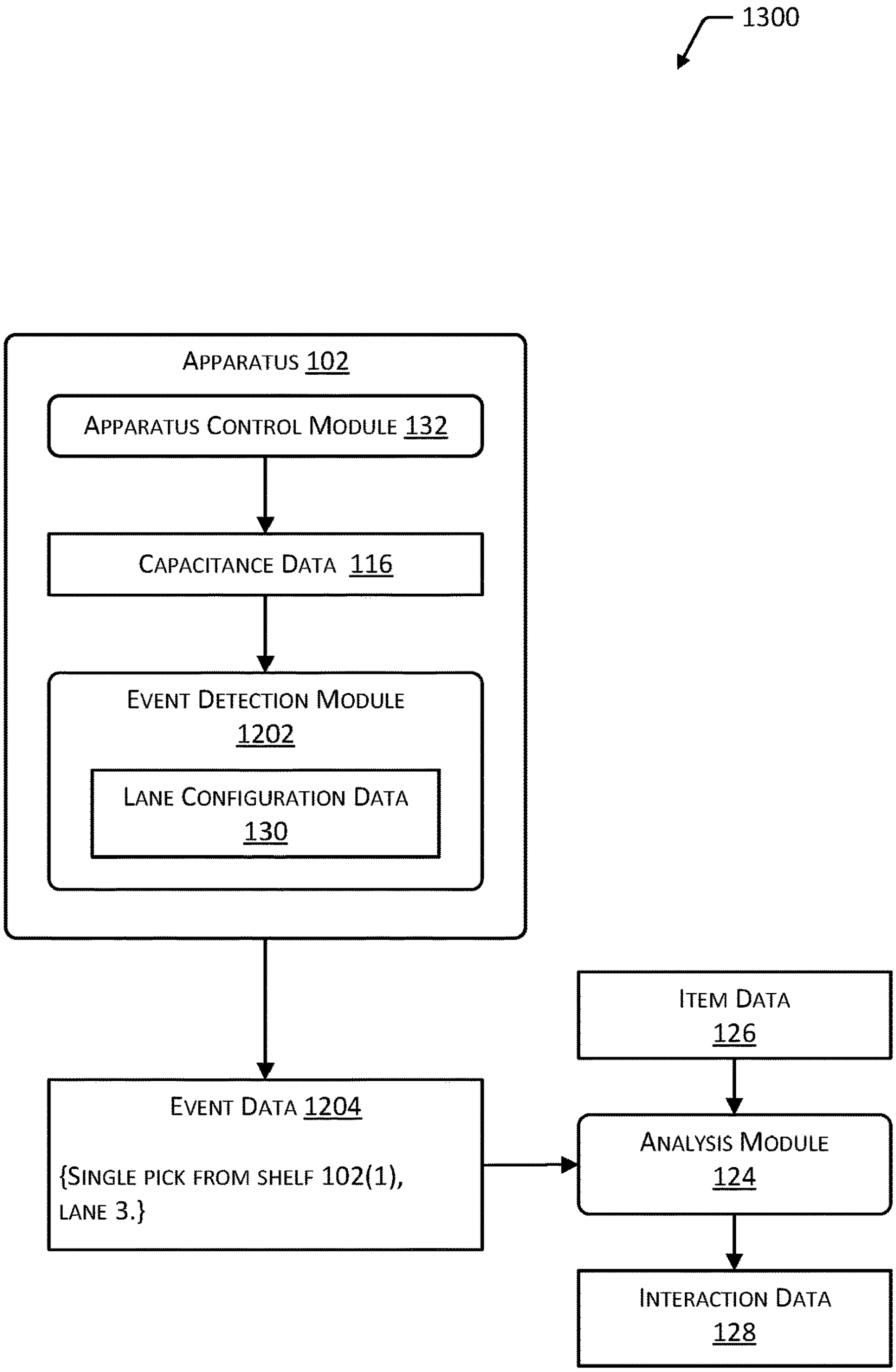
FIG. 13 depicts a block diagram of a second implementation to determine interaction data.

FIG. 13 depicts a block diagram 1300 of a second implementation to determine interaction data 128. In this implementation, the apparatus 102 includes the apparatus control module 132 and the event detection module 1202. During operation, the apparatus control module 132 sends capacitance data 116 to the event detection module 1202. The event detection module 1202 may utilize the lane configuration data 130 to determine the event data 1204. The event data 1204 may then be sent to the analysis module 124 executing on another computing device. The analysis module 124 may then process the event data 1204 as described above to determine the interaction data 128.

During operation, the apparatus control module 132 may sum the capacitance data 116 acquired from two or more sensor elements 150. For example, first capacitance data 116(1) acquired using sensor element 150(14) and second capacitance data 116(2) acquired using sensor element 150 (15) may be combined via summing, averaging, or other techniques to determine capacitance data 116 that is associated with lane 104(7), such as shown in FIG. 17.

The event data 1204 provided by the event detection module 1202 of the apparatus 102 may comprise information indicative of an estimated location, such as a lane 104, a type of interaction such as a pick or place, and may include information such as a quantity of items 106 added or removed, and so forth. For example, the determination of a pick or place may be based on a difference in capacitance values before and after an event. The mathematical sign of the difference between those values may be used to determine a pick or a place of an item 106.

The event detection module 1202 or other modules such as a portion of the analysis module 124 may utilize various methods to determine one or more of the event data 1204 or the interaction data 128. An interrupt method is discussed with regard to FIG. 14. A polling method is discussed with regard to FIG. 15.

Figure 14:
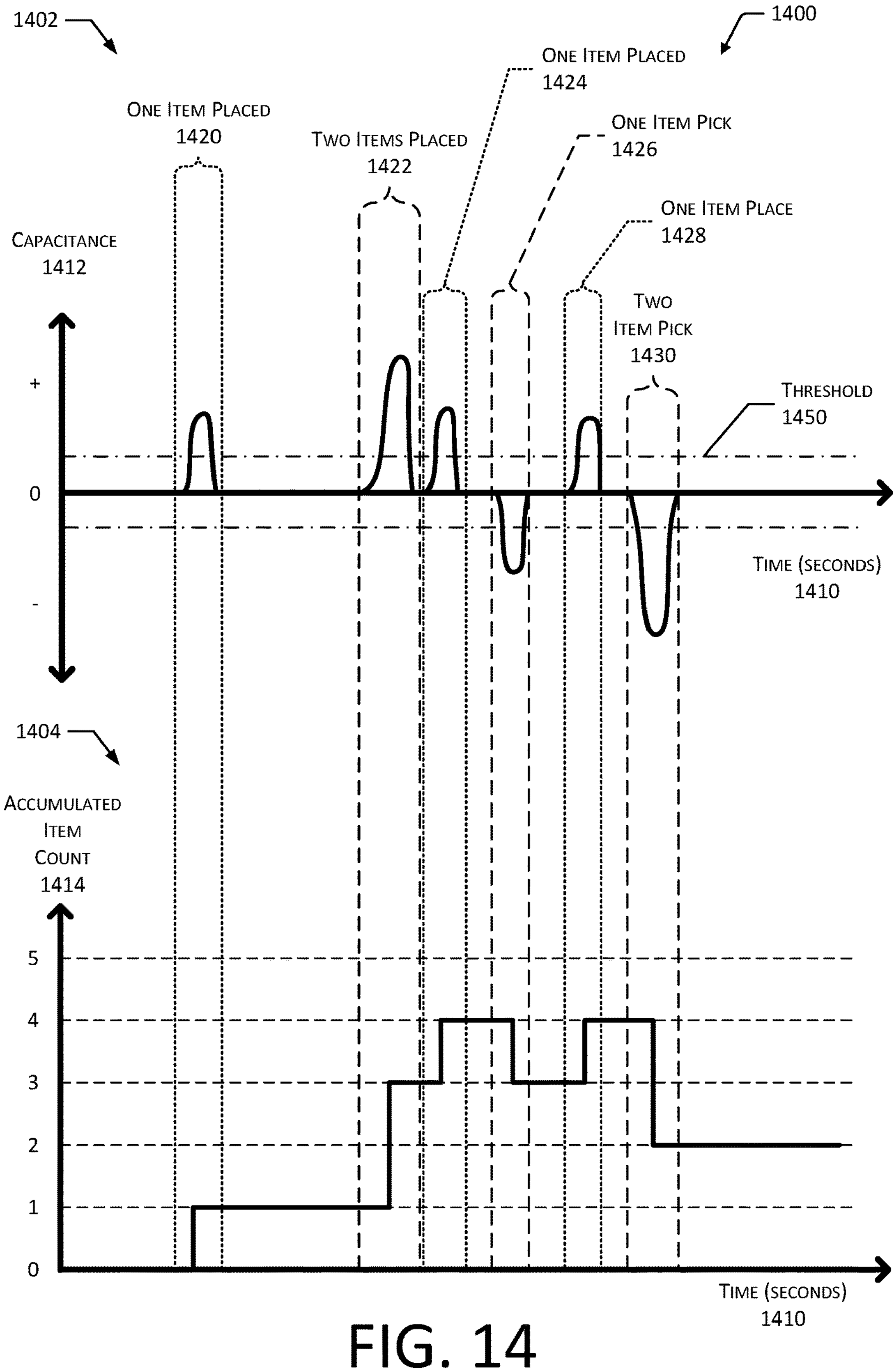
FIG. 14 depicts graphs of capacitance and an interrupt-based technique to accumulate item count over time responsive to various interactions, according to some implementations.

FIG. 14 depicts at 1400 graphs of capacitance and an interrupt-based technique to accumulate item count over time responsive to various interactions, according to some implementations. For ease of illustration, and not as a limitation, these graphs are associated with a single lane 104 used to stow homogenous items 106.

As described with regard to FIG. 11, several interactions produce well defined changes in capacitance that may be used to determine one or more attributes of the event data 1204 or the interaction data 128. A first graph 1402 depicts changes in capacitance over time while a second graph 1404 depicts accumulated item count.

A horizontal axis depicts time 1410 in seconds, increasing from left to right. With regard to the first graph 1402, a vertical axis depicts capacitance 1412 as determined by the apparatus control module 132. With regard to the second graph 1404, a vertical axis depicts an accumulated item count 1414.

In this illustration, a threshold value 1450 of capacitance is specified. The threshold value 1450 may be determined based on testing, item data 126, during initial setup of the apparatus 102, and so forth. With regard to the interrupt method depicted, a change in capacitance 1412 that exceeds the threshold 1450 generates an interrupt that updates the value of the accumulated item count 1414. The mathematical sign of the difference in the capacitance may be used to determine if the interaction is a pick or a place. For example, a positive change in capacitance may indicate a place, while a negative change in capacitance may indicate a pick. In some implementations the magnitude of the change may be indicative of the quantity of items 106 picked or placed.

The technique may begin operation with a known quantity of items 106 at the apparatus 102. For example, at time 0 no items 106 are present. Six events 1420 through 1430 are depicted.

At 1420 a positive change in capacitance is noted that exceeds the threshold 1450, with an amplitude indicative of one item 106 being placed. The accumulated item count 1414 is correspondingly updated to a value of "1".

At 1422 two items 106 are placed. The positive change in capacitance is noted that exceeds the threshold 1450, with an amplitude indicative of two items 106, corresponding to two items 106 being placed. The accumulated item count 1414 is correspondingly updated to a value of "3".

At 1424 a positive change in capacitance is noted that exceeds the threshold 1450, with an amplitude indicative of one item 106 being placed. The accumulated item count 1414 is correspondingly updated to a value of "4".

At 1426 a negative change in capacitance is noted that exceeds the threshold 1450, with an amplitude indicative of one item 106 being picked. The accumulated item count 1414 is correspondingly updated to a value of "3".

At 1428 a positive change in capacitance is noted that exceeds the threshold 1450, with an amplitude indicative of one item 106 being placed. The accumulated item count 1414 is correspondingly updated to a value of "4".

At 1430 a negative change in capacitance is noted that exceeds the threshold 1450, with an amplitude indicative of two items 106 being picked. The accumulated item count 1414 is correspondingly updated to a value of "2".

Between the events, the apparatus 102 may be operated in a low-power mode. For example, as described below, the apparatus 102 may be operated in a proximity detection mode that determines capacitance data 116 at a low sample rate, such as once every 500 milliseconds, and for a specified set of sensor elements 150, such as all. Upon determining the presence of an object, such as the user 108, the apparatus 102 may transition from a low power mode to an active mode during which capacitance data 116 is determined at a faster sample rate such as every 100 ms and for sets of sensor elements 150 that are associated with particular lanes 104.

Figure 15:
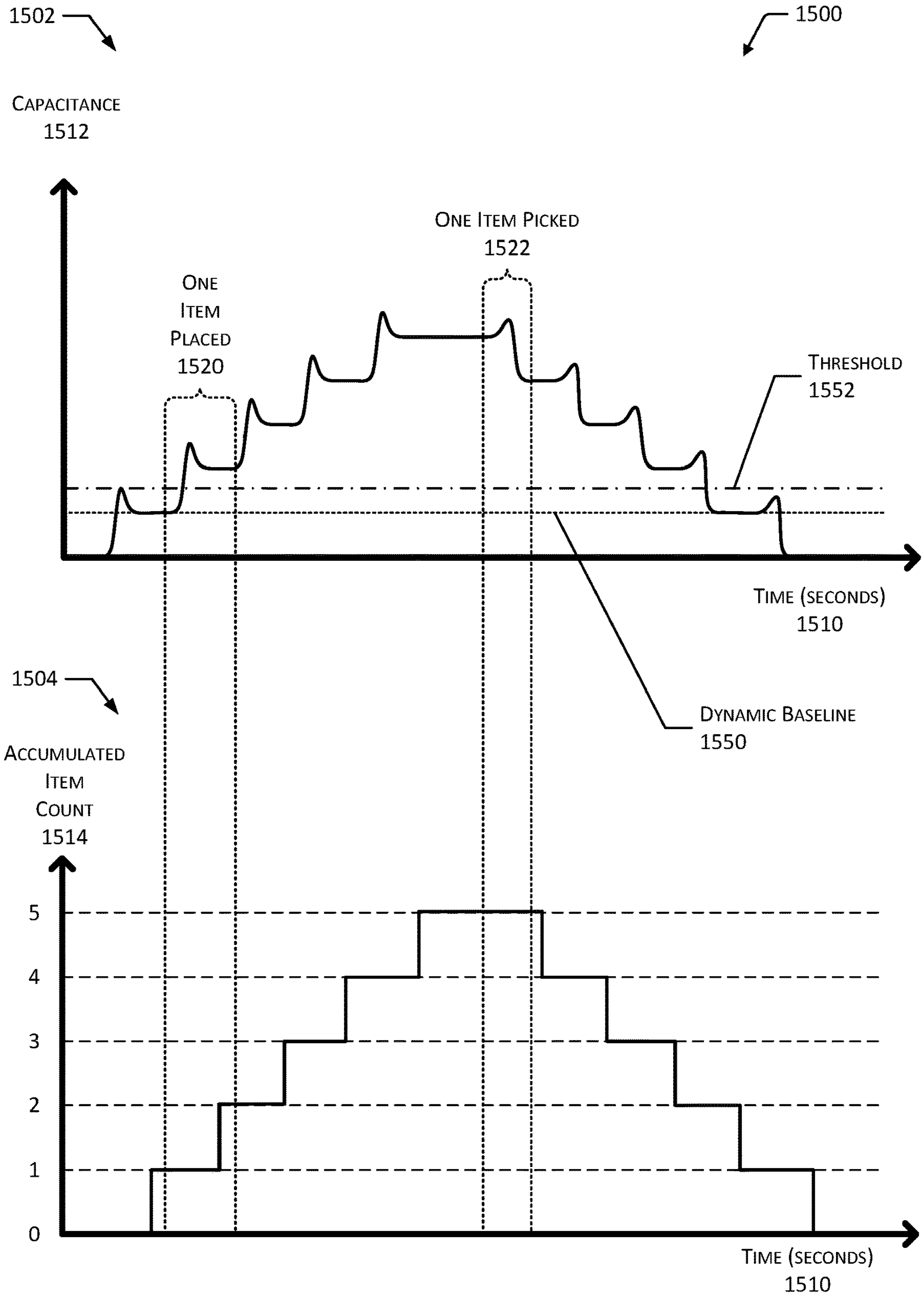
FIG. 15 depicts graphs of capacitance and a polling-based technique to accumulate item count over time responsive to various interactions, according to some implementations.

FIG. 15 depicts at 1500 graphs of capacitance and a polling-based technique to accumulate item count over time responsive to various interactions, according to some implementations. For ease of illustration, and not as a limitation, these graphs are associated with a single lane 104 used to stow homogenous items 106. In this illustration, at time 0 the lane 104 is empty.

As described with regard to FIG. 11, several interactions produce well defined changes in capacitance that may be used to determine one or more attributes of the event data 1204 or the interaction data 128. A first graph 1502 depicts changes in capacitance over time while a second graph 1504 depicts an accumulated item count.

A horizontal axis depicts time 1510 in seconds, increasing from left to right. With regard to the first graph 1502, a vertical axis depicts capacitance 1512 as determined by the apparatus control module 132. With regard to the second graph 1504, a vertical axis depicts an accumulated item count 1514.

Shown in these graphs are five individual instances of one item placed 1520 and five individual instances of one item picked 1522. During operation, the apparatus control module 132 performs an ongoing polling of the set of sensor elements 150 associated with the lane 104, providing ongoing capacitance 1512 values at successive times.

As items 106 are placed, the capacitance 1512 increases. As items 106 are picked, the capacitance 1512 decreases. After an event takes place, such as a pick or a place, a dynamic baseline 1550 is determined. For example, the dynamic baseline 1550 may comprise a simple average, moving average, linear fit, and so forth of the capacitance values for a specified interval of time. A threshold value 1552 is specified, relative to the dynamic baseline 1550. The threshold value 1550 may be determined based on testing, item data 126, during initial setup of the apparatus 102, and so forth.

With regard to the polling method depicted, a change in capacitance 1512 with respect to the dynamic baseline that exceeds the threshold 1552 may be used to update the value of the accumulated item count 1514. The mathematical sign of the difference in the capacitance relative to the dynamic baseline 1550 may be used to determine if the interaction is a pick or a place. For example, a positive change in capacitance may indicate a place, while a negative change in capacitance may indicate a pick. In some implementations the magnitude of the change may be indicative of the quantity of items 106 picked or placed.

With regard to the illustration, as items 106 are successively added, the capacitance 1512 increases. The dynamic baseline 1550, and associated threshold 1552 are also increased. As items 106 are successively picked, the capacitance 1512 decreases. The dynamic baseline 1550, and associated threshold 1552 are also decreased.

In some implementations, the apparatus 102 may be operated using the polling-based technique to determine and maintain capacitance data 116 over an extended period of time. The data from the extended period of time may be used to characterize operation of the apparatus 102. For example, drift in the capacitance 1512 over time may be characterized using the data obtained using the polling-based technique.

In some circumstances both the interrupt-based technique and the polling-based technique may be used contemporaneously by the same apparatus 102.

Figure 16:
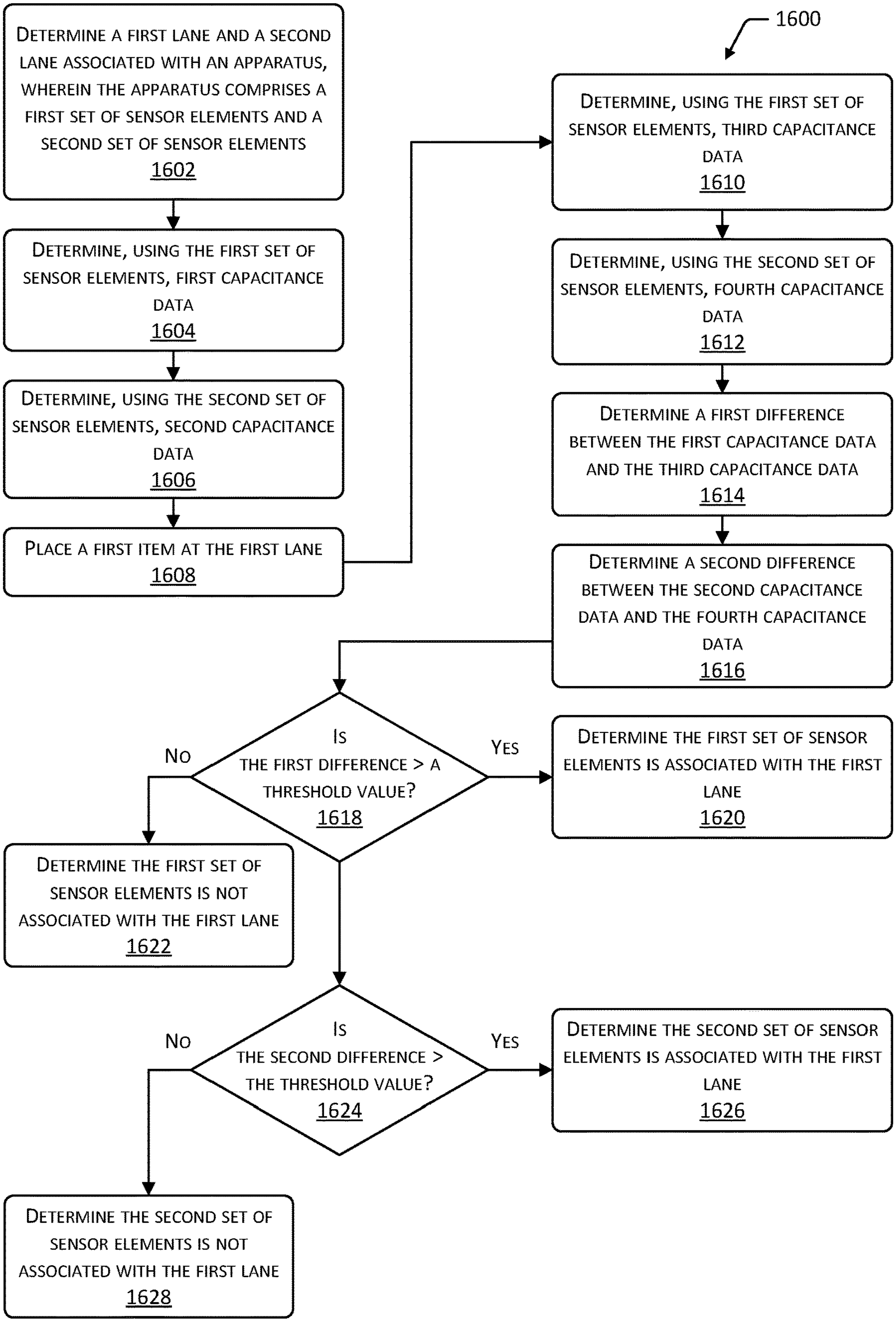
FIG. 16 is a flow diagram of a process for determining the association between sensor elements and lanes at an inventory location, according to some implementations.

FIG. 16 is a flow diagram 1600 of a process for determining the association between sensor elements 150 and lanes 104 at an inventory location, according to some implementations. The process may be implemented at least in part by the apparatus control module 132. In some situations, it may be advantageous to determine the association of sets of one or more sensor elements 150 and a particular lane 104. This association may be stored as the lane configuration data 130.

At 1602 a first lane 104(1) and a second lane 104(2) associated with an apparatus 102 are determined. The apparatus 102 comprises a first set of sensors elements 150 and a second set of sensor elements 150. For example, the first set of sensor elements 150 may comprise the first sensor element 150(1) and the second set of sensor elements 150 may comprise the second sensor element 150(2).

At 1604, using the first set of sensor elements, first capacitance data 116 is determined.

At 1606, using the second set of sensor elements, second capacitance data 116 is determined.

At 1608 a first item 106 is placed at the first lane 104(1). A determination as to the placement of the first item 106 may be based on one or more of a difference between the first capacitance data 116 and the second capacitance data 116, user input, expiration of a timer after presentation of output using an output device such as a light or speaker, and so forth. For example, during this process a user interface may be presented on a tablet computer that prompts to user to "place one item in the first lane" and includes a user input control that allows indication that this operation has been completed.

In another implementation, before 1604, a first item 106 may be placed at the first lane 104(1) and at 1608 the first item 106 may be removed.

At 1610, using the first set of sensor elements, third capacitance data 116 is determined.

At 1612, using the second set of sensor elements, fourth capacitance data 116 is determined.

At 1614 a first difference is determined between the first capacitance data 116 and the third capacitance data 116.

At 1616 a second difference is determined between the second capacitance data 116 and the fourth capacitance data 116.

Based on the first difference and the second difference, an association between the first lane 104(1) and one or more of the first set of sensor elements 150 or the second set of sensor elements 150 may be made. One implementation of this association is depicted with regard to the determinations of 1618 and 1624.

At 1618 if the first difference is greater than a threshold value, at 1620 the first set of sensor elements 150 are determined to be associated with the first lane 104(1). If not, at 1622 the first set of sensor elements 150 are determined to not be associated with the first lane 104(1).

At 1624 if the second difference is greater than a threshold value, at 1626 the second set of sensor elements 150 are determined to be associated with the first lane 104(1). If not, at 1628 the second set of sensor elements 150 are determined to not be associated with the first lane 104(1).

The process may be iterated, using various combinations of sets of sensor elements 150.

Once a set of sensor elements 150 have been associated with a particular lane 104, during operation the system 100 may combine the data from the individual sensor elements 150 in the set. For example, if the set of sensor elements 150 comprises a first sensor element 150(1) and a second sensor element 150(2), the apparatus control module 132 or another computing device may sum the capacitance data 116 associated with the two to determine the capacitance data 116 for the set of sensor elements 150.

FIG. 17 depicts at 1700 active and inactive sensor elements 150 associated with respective lanes 104, according to some implementations. During operation, the apparatus control module 132 may selectively connect particular sensor elements 150 using the switch module 212.

A first view 1702 depicts a top view of the apparatus 102 showing rectangular sensor elements 150(1)-(20) and lanes 104(1)-(8) with items 106. In some implementations, such as shown here, the relative arrangement of lanes 104 to sensor elements 150 may not be one-to-one. For example, some items 106 and their associated lanes 104 are wider than other items 106. Also, the left-to-right edges of lanes 104 may differ from the left-to-right edges of the individual sensor elements 150. The ability to support these various configurations significantly improves the usability of the system 100.

A second view 1704 depicts the top view of the apparatus 102 with the items 106 removed. The second view 1704 depicts inactive elements 1706 and active elements 1708. While determining the capacitance data 116, inactive elements 1706 may comprise those sensor elements 150 that are omitted from use by the apparatus control module 132. For example, during operation the switch module 212 may not connect the inactive elements 1706 to the signal source of the capacitive sensor module 206. In comparison, an active element 1708 may comprise one or more sensor elements 150 that are connected via the switch module 212 to the capacitive sensor module 206 to determine capacitance data 116 at the same time. For example, the apparatus control module 132 is used to determine capacitance data 116 associated with the sensor element 150(1).

By selectively operating the sensor elements 150, the quality of the interaction data 128 may be improved. For example, with regard to lane 104(3), sensor element 150(6) is an active element 1708 while immediately adjacent sensor elements 150(5) and 150(7) are inactive elements 1706. This results in capacitance data 116 that is better representative of the changes associated with lane 104(3), and less prone to changes due to interactions with adjacent lanes 104(2) or 104(4).

By selectively operating the sensor elements 150, other operational factors may also be improved. For example, by not using the inactive elements 1706, the quantity of capacitance data 116 generated and subsequently processed is reduced. In another example, by not using the inactive elements 1706, power consumption and corresponding power dissipation is reduced. In yet another example, by not using the inactive elements 1706, system latency is reduced as only the active elements 1708 are scanned.

Figure 18A:
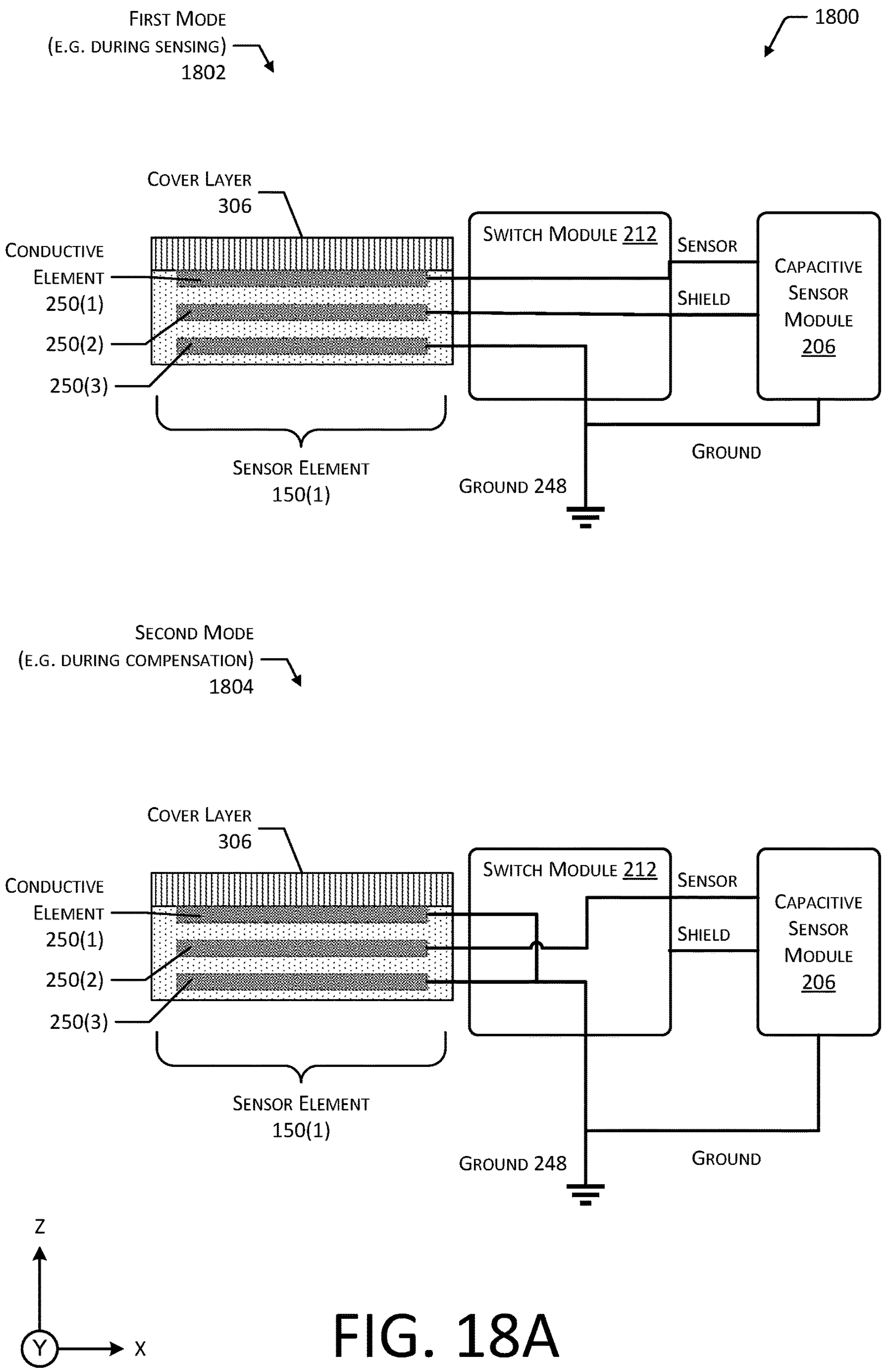
FIG. 18A depicts block diagrams of the conductive elements and respective connections for a first mode and a second mode, according to some implementations.

FIG. 18A depicts at 1800 block diagrams of the conductive elements 250 and respective connections for a first mode and a second mode, according to some implementations. The operations associated with these modes may be implemented at least in part by the apparatus control module 132, or portions thereof as shown. These modes may be utilized with various configurations of conductive elements 250, such as described herein.

A first mode 1802 depicts the configuration of the conductive elements 250 during capacitance sensing. For example, the first mode 1802 may be used to determine the load capacitance data 254.

While in the first mode 1802, the switch module 212 connects a sensor terminal of the capacitive sensor module 206, such as connected to a capacitive signal source, to the first conductive element 250(1). The first conductive element 250(1) is beneath the cover layer 306.

While in the first mode 1802, the switch module 212 connects a shield terminal of the capacitive sensor module 206, such as connected to a shield signal source, to the second conductive element 250(2). The second conductive element 250(2) is located beneath the first conductive element 250(1).

While in the first mode 1802, the switch module 212 connects the third conductive element 250(3) to the ground 248. The capacitive sensor module 206 may also be connected to the ground 248. In the first mode 1802, during operation the relative arrangement of the conductive elements 250(1)-(3) an electric field extends above the cover layer 306.

A second mode 1804 depicts the configuration of the conductive elements 250 during compensation sensing. For example, the second mode 1804 may be used to determine the reference capacitance data 256. Due to various factors, such as variations in manufacture, ambient temperature, temperature of an item 106 that is in contact with the apparatus 102, and so forth, the capacitance values determined may vary. The second mode 1804 may be used to compensate for these variations.

While in the second mode 1804, the switch module 212 connects the first conductive element 250(1) and the third conductive element 250(3) to the ground 248.

While in the second mode 1804, the switch module 212 connects the second conductive element 250(2) to the capacitive signal source.

In the second mode 1804, during operation the relative arrangement of the conductive elements 250(1)-(3) and an electric field extends between the conductive elements 250 (1)-(3) and without substantial extension above the cover layer 306. The resulting reference capacitance data 256 is representative of the capacitance between the conductive elements 250(1)-(3), and not due to a load on the apparatus 102 or an underlying supporting shelf or other structure.

Figure 18B:
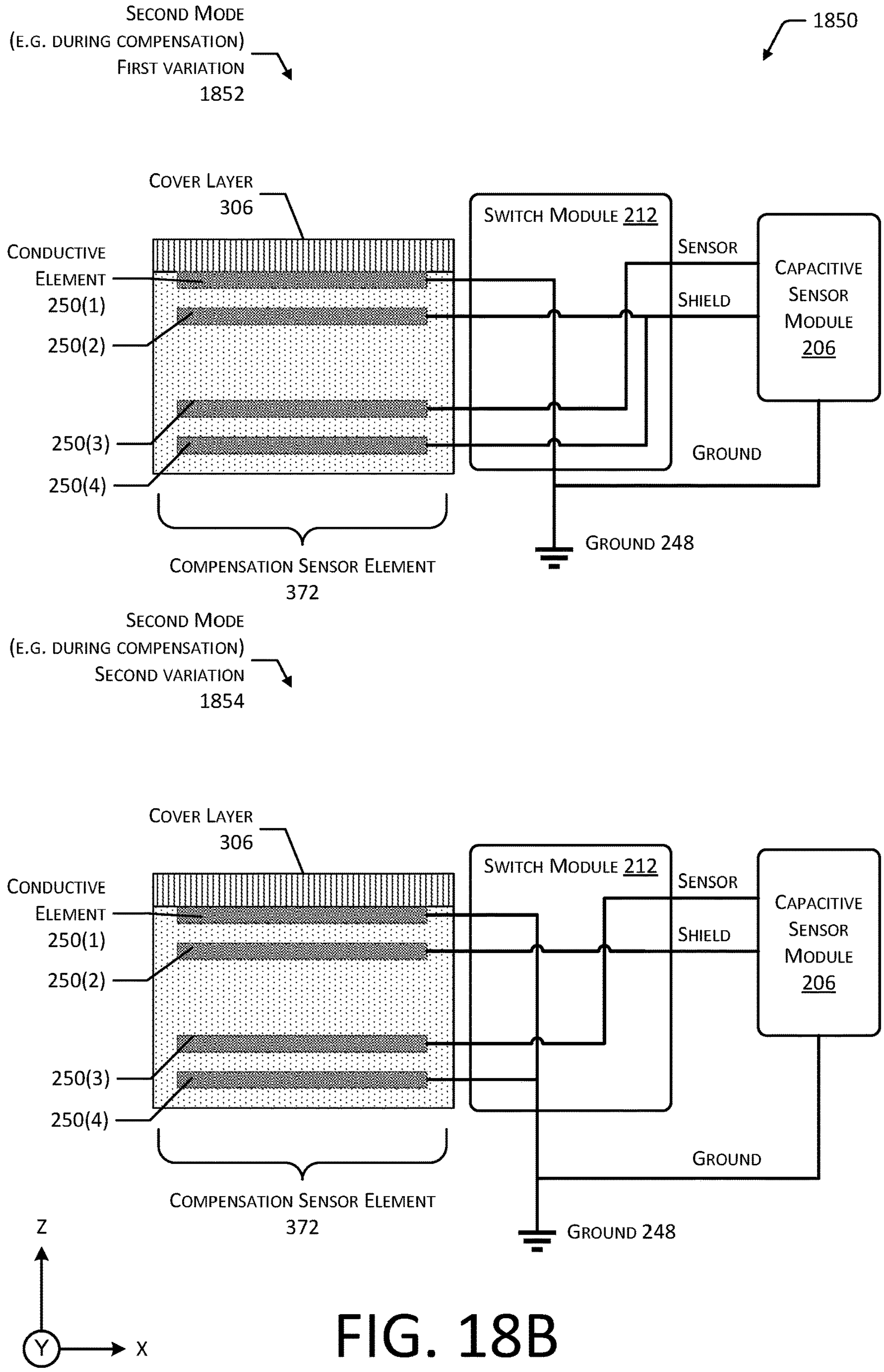
FIG. 18B depicts block diagrams of the conductive elements and respective connections for a first variation and a second variation of the second mode, according to some implementations.

FIG. 18B depicts at 1850 block diagrams of the conductive elements 250 and respective connections for a first variation and a second variation of the second mode, according to some implementations. The operations associated with this mode and variations may be implemented at least in part by the apparatus control module 132, or portions thereof as shown. These modes and variations may be utilized with various configurations of conductive elements 250, such as described herein.

At 1852 a first variation of the second mode 1804 is shown that depicts the configuration of the conductive elements 250 of a compensation sensor element 372 during compensation sensing. For example, the second mode 1804 may be used to determine the reference capacitance data 256. Due to various factors, such as variations in manufacture, ambient temperature, temperature of an item 106 that is in contact with the apparatus 102, and so forth, the capacitance values determined may vary. The second mode 1804 may be used to compensate for these variations.

While in the first variation of the second mode 1804, the switch module 212 connects the first conductive element 250(1) to the ground 248.

While in the first variation of the second mode 1804, the switch module 212 connects the second conductive element 250(2) and the fourth conductive element 250(4) to the shield signal source.

While in the first variation of the second mode 1804, the switch module 212 connects the third conductive element 250(3) to the signal source.

The resulting reference capacitance data 256 is representative of the capacitance between the conductive elements 250(1)-(4), and not due to a load on the apparatus 102 or an underlying supporting shelf or other structure.

At 1854 a second variation of the second mode 1804 is shown that depicts the configuration of the conductive elements 250 of a compensation sensor element 372 during compensation sensing. For example, the second mode 1804 may be used to determine the reference capacitance data 256. Due to various factors, such as variations in manufacture, ambient temperature, temperature of an item 106 that is in contact with the apparatus 102, and so forth, the capacitance values determined may vary. The second mode 1804 may be used to compensate for these variations.

While in the second variation of the second mode 1804, the switch module 212 connects the first conductive element 250(1) and the fourth conductive elements 250(4) to the ground 248.

While in the second variation of the second mode 1804, the switch module 212 connects the second conductive element 250(2) to the shield signal source.

While in the second variation of the second mode 1804, the switch module 212 connects the third conductive element 250(3) to the signal source.

The resulting reference capacitance data 256 is representative of the capacitance between the conductive elements 250(1)-(4), and not due to a load on the apparatus 102 or an underlying supporting shelf or other structure.

Figure 19A:
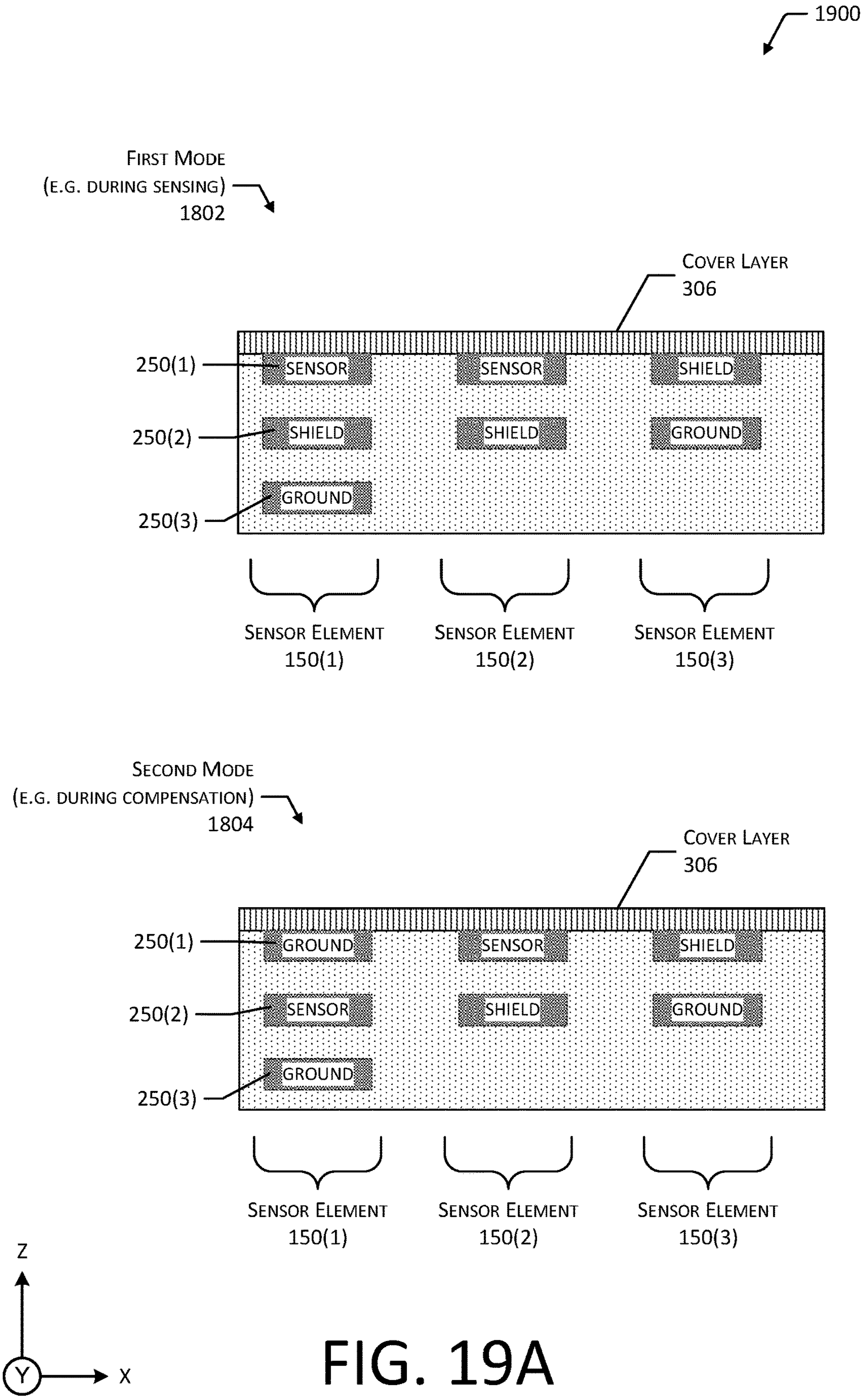
FIG. 19A depicts conductive element configurations for a first conductive element arrangement in the first mode and the second mode, according to some implementations.

FIG. 19A depicts at 1900 conductive element configurations for a first conductive element arrangement in the first mode 1802 and the second mode 1804, according to some implementations. The configurations associated with these modes may be implemented at least in part by the apparatus control module 132, or portions thereof as shown.

The configuration depicted comprises conductive elements 250 arranged as described with respect to FIG. 4. The sensor element 150(1) has three conductive elements 250 (1)-(3) while other sensor elements 150(2)-(3) have two conductive elements 250(1)-(2). As described above, in some implementations the third conductive elements 250(3) may comprise a second assembly.

In the first mode 1802 while operating the first sensor element 150(1), the switch module 212 connects the conductive elements 250(1)-(3) as discussed with regard to FIG. 18.

While in the first mode 1802 and operating the second sensor element 150(2), the switch module 212 connects a sensor terminal of the capacitive sensor module 206, such as connected to a capacitive signal source, to the first conductive element 250(1) of the second sensor element 150(2). The switch module 212 also connects a shield terminal of the capacitive sensor module 206, such as connected to a shield signal source, to the second conductive element 250(2) of the second sensor element 150(2). The second conductive element 250(2) of the second sensor element 150(2) is located beneath the first conductive element 250(1) of the second sensor element 150(2).

While in the first mode 1802 and operating the second sensor element 150(2), the adjacent sensor element 150(3) may also be used. As shown here, while sensor element 150(2) is being operated, the third sensor element 150(3) is connected by the switch module 212 such that the first conductive element 250(1) of the third sensor element 150(3) is connected to the shield signal source, while the second conductive element 250(2) of the third sensor element 150(3) is connected to the ground 248.

During operation in the first mode 1802 of a sensor element 150 that comprises the two conductive elements 250(1)-(2), the adjacent sensor element 150 that also comprises two conductive elements 250(1)-(2) may be operated in this way.

In the second mode 1804 while operating the first sensor element 150(1), the switch module 212 connects the conductive elements 150(1)-(3) as discussed with regard to FIG. 18.

While in the second mode 1804 and operating the first sensor element 150(1), in the implementation shown in FIG. 19 the switch module 212 may also connect the capacitive signal source to a first conductive element 250(1) of an adjacent sensor element 150(2), and the shield signal source to the second conductive element 250(2) of the second sensor element 150(2).

While in the second mode 1804 and operating the first sensor element 150(1), the switch module 212 may connect the next adjacent sensor element, such as sensor element 150(3) such that the first conductive element 250(1) of the third sensor element 150(3) is connected to the shield signal source, while the second conductive element 250(2) of the third sensor element 150(3) is connected to the ground 248.

Figure 19B:
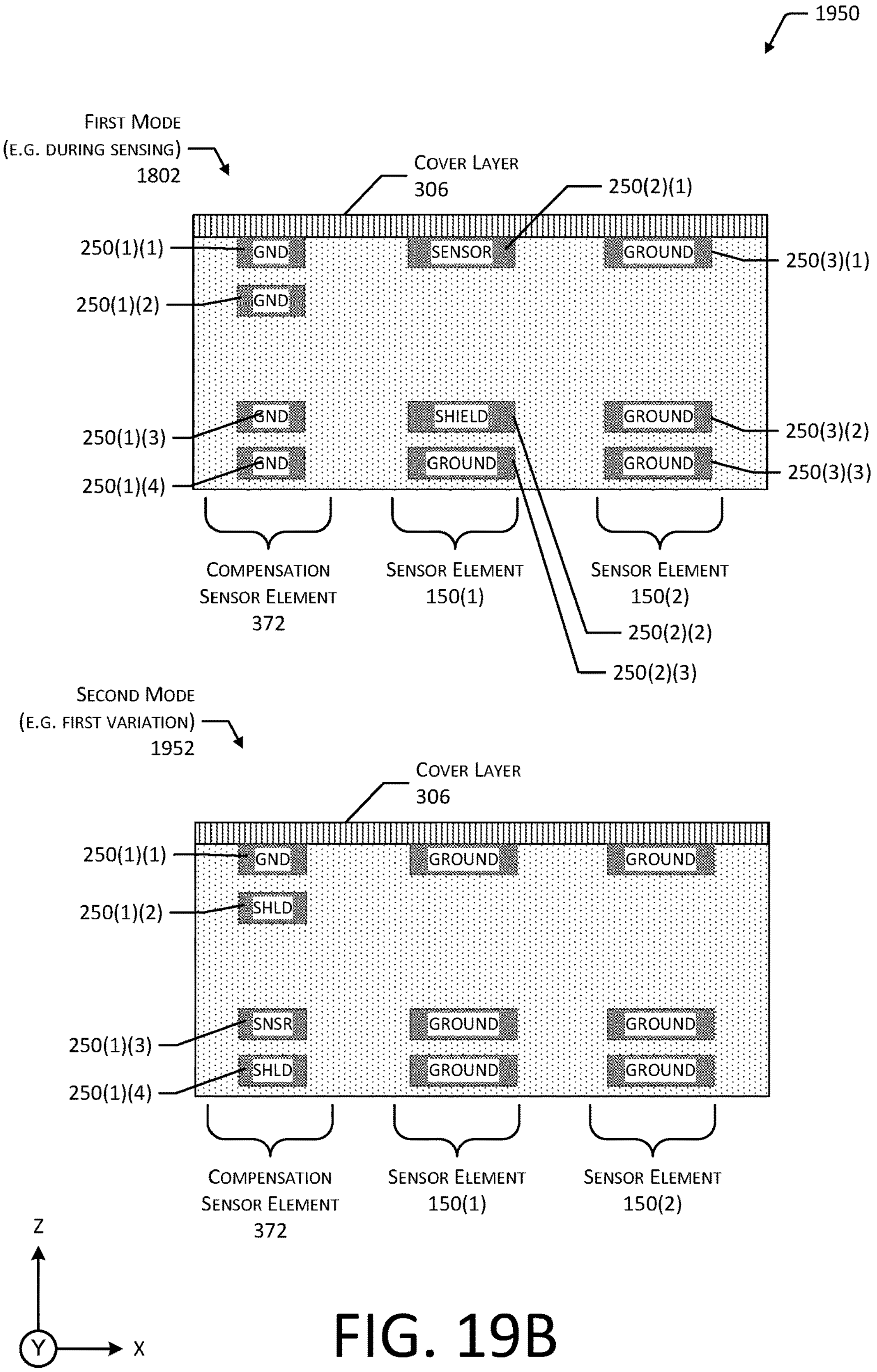
FIG. 19B depicts conductive element configurations for a second conductive element arrangement in the first mode and a first variation of the second mode, according to some implementations.

FIG. 19B depicts at 1950 conductive element configurations for a second conductive element arrangement in the first mode 1802 and the second mode 1804, according to some implementations. The configurations associated with these modes may be implemented at least in part by the apparatus control module 132, or portions thereof as shown.

The configuration depicted comprises conductive elements 250 arranged in a variation of those described with respect to FIGS. 3A and 3B. In particular, a compensation sensor element 372 that comprises four conductive elements 250(1)(1)-(1)(4) and sensor elements 150 that comprise three conductive elements 250(2)(1)-(2)(3).

The compensation sensor element 372 has four conductive elements 250(1)(1)-(1)(4) while the sensor elements 150(1)-(2) have three conductive elements 250(M)(1)-(M)(3). In some implementations the fourth conductive element 250(4) may comprise a second assembly as described above.

In the first mode 1802 while operating the first sensor element 150(1), the switch module 212 connects the conductive elements 250(1)-(3) as discussed with regard to FIG. 18A.

While in the first mode 1802 and operating the first sensor element 150(1), the switch module 212 may connect the conductive elements 250(1)(1)-(1)(4) of an adjacent compensation sensor element 372 to the ground 248.

While in the first mode 1802 and operating the first sensor element 150(1), the switch module 212 may connect the conductive elements 250(3)(1)-(3)(3) of an adjacent second sensor element 150(2) to the ground 248.

At 1952 in the second mode 1804 while operating the compensation sensor element 372 in a first variation, the switch module 212 connects the conductive elements 250(1)(1)-(1)(4) as discussed with regard to FIG. 18B at 1842.

In the second mode 1804 while operating the compensation sensor element 372 in the first variation, the switch module 212 may connect adjacent conductive elements to the ground 248.

Figure 19C:
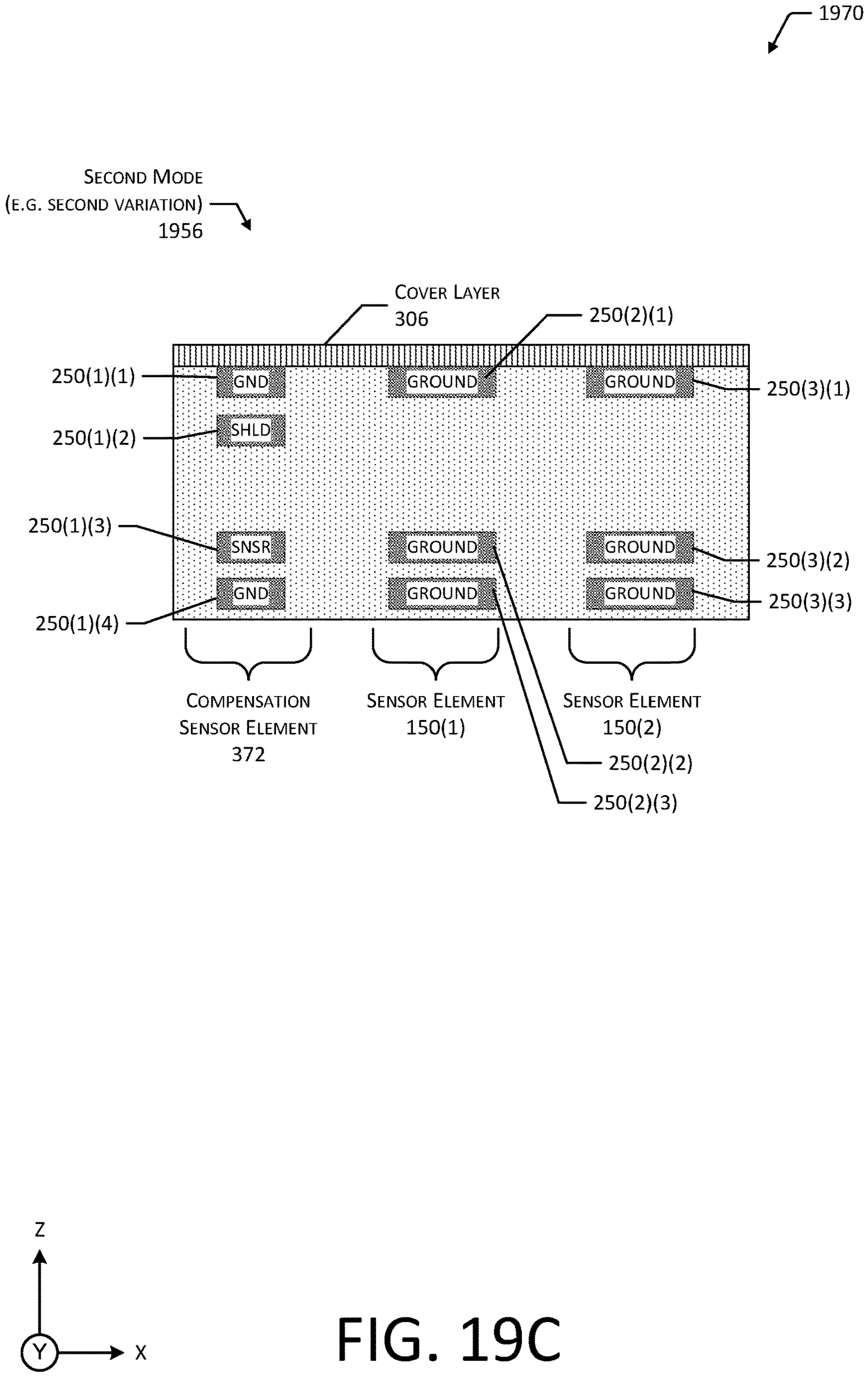
FIG. 19C depicts conductive element configurations for the second conductive element arrangement in a second variation of the second mode, according to some implementations.

FIG. 19C depicts at 1970 conductive element configurations for a second conductive element arrangement in the second variation of the second mode 1804, according to some implementations. The configurations associated with these modes may be implemented at least in part by the apparatus control module 132, or portions thereof as shown.

At 1956 in the second mode 1804 while operating the compensation sensor element 372 in a second variation, the switch module 212 connects the conductive elements 250(1)(1)-(1)(4) as discussed with regard to FIG. 18B at 1854.

In the second mode 1804 while operating the compensation sensor element 372 in the second variation, the switch module 212 may connect adjacent conductive elements 250 to the ground 248.

Figure 20:
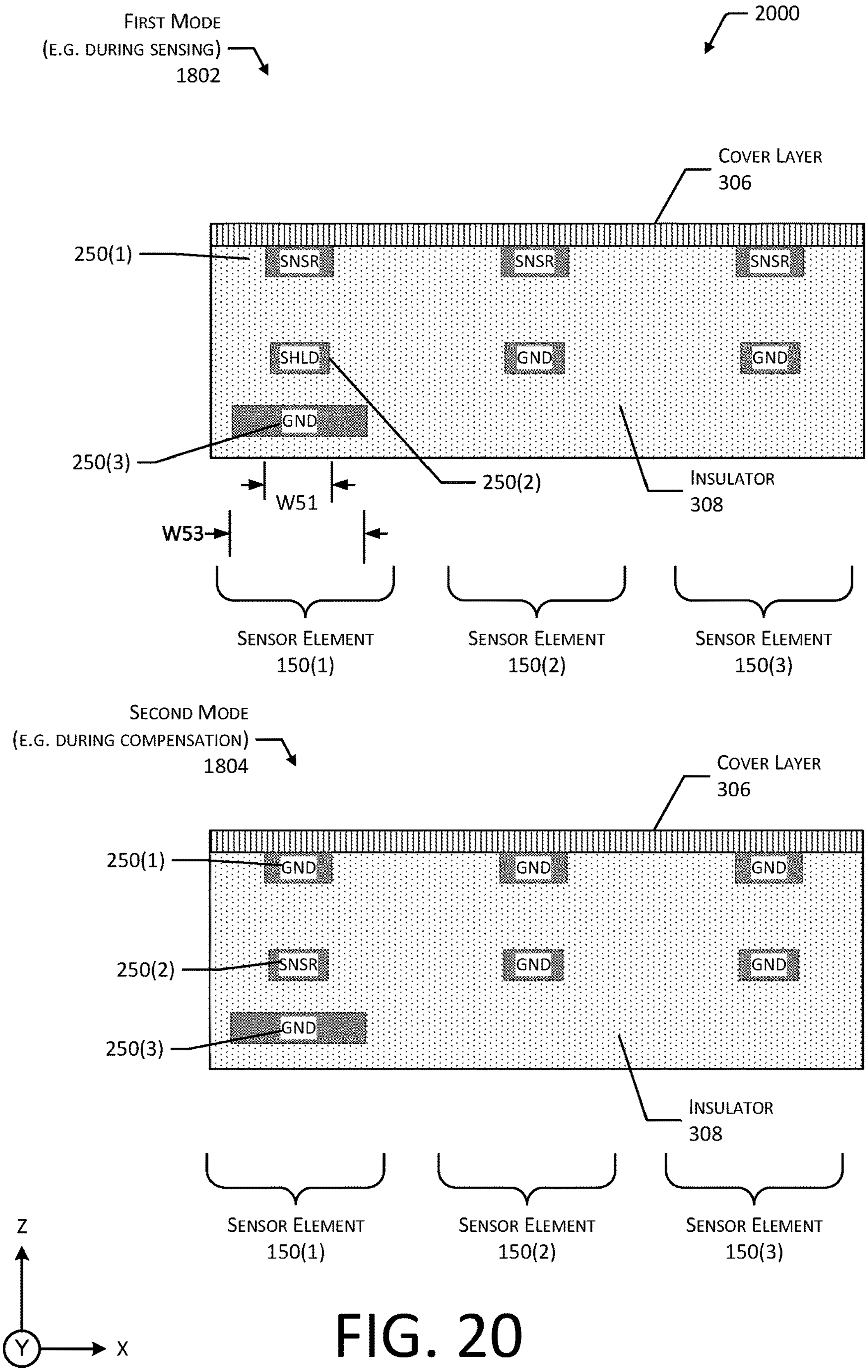
FIG. 20 depicts conductive element configurations for a second conductive element arrangement in the first mode and the second mode, according to some implementations.

FIG. 20 depicts at 2000 conductive element configurations for a second conductive element 250 arrangement in the first mode 2002 and the second mode 2004, according to some implementations.

The configuration depicted comprises conductive elements 250 arranged as described with respect to FIG. 5. The sensor element 150(1) has three conductive elements 250(1)-(3) while other sensor elements 150(2)-(3) have two conductive elements 250(1)-(2). The first conductive elements 250(1) have a width W51 that is greater than the widths W53 of the second conductive elements 250(2) and the third conductive elements 250(3). As described above, in some implementations the third conductive elements 250(3) may comprise a second assembly.

In the first mode 1802 while operating the first sensor element 150(1), the switch module 212 connects the conductive elements 150(1)-(3) as discussed with regard to FIG. 18.

While in the first mode 1802 and operating the second sensor element 150(2), the switch module 212 connects a sensor terminal of the capacitive sensor module 206, such as connected to a capacitive signal source, to the first conductive element 250(1) of the second sensor element 150(2). The switch module 212 also connects the second conductive element 250(2) of the second sensor element 150(2) to the ground 248.

In the second mode 1804 while operating the first sensor element 150(1), the switch module 212 connects the conductive elements 150(1)-(3) as discussed with regard to FIG. 18.

While in the second mode 1804, the sensor elements 150(2)-(3) having only the first conductive element 250(1) and the second conductive elements 250(2) may not be utilized, or may be connected to ground 248 as shown.

FIG. 21 is a flow diagram 2100 of a process for using the apparatus 102 to determine compensation data, according to some implementations. The process may be implemented at least in part by the apparatus control module 132.

At 2102, at a first time, first capacitance data 116 is determined using the first set of sensor elements 150 operated in a first mode 1802. For example, the apparatus control module 132 determines load capacitance data 254(1).

At 2104, at a second time, second capacitance data 116 is determined using the first set of sensor elements 150 operated in the second mode 1804. For example, the apparatus control module 132 determines reference capacitance data 256(1).

At 2106 first compensation data is determined based on the first and second capacitance data 116. For example, the compensation module 258 may determine the first compensation data based on a difference between the reference capacitance data 256(1) and the load capacitance data 254 (1). In another example, the compensation module 258 may determine the first compensation data based on a lookup table, mathematical function, or ratio, that is representative of a relationship between the load capacitance data 254(1) and the reference capacitance data 256(1).

At 2108, based on the first capacitance data 116 and the first compensation data, first compensated capacitance data is determined. For example, the compensation module 258 may multiply the load capacitance data 254(1) by a correction factor to determine the first compensated capacitance data. The capacitance data 116 may comprise the compensated capacitance data.

In implementations for which the sensor element 150 is not associated with a third conductive element 250(3), the compensation data for an adjacent or proximate sensor element 150 that does include the three conductive elements 250(1)-(3) may be used to determine the compensated capacitance data for that sensor element 150.

The compensation data and the associated compensated capacitance data may be determined before or after the determination of capacitance data 116. For example, the apparatus control module 132 may determine the compensation data and provide as output the compensated capacitance data for each measurement, as depicted in this implementation.

At 2110, at a third time, third capacitance data 116 is determined using the first set of sensor elements 150 operated in the first mode 1802. For example, the apparatus control module 132 determines load capacitance data 254 (2).

At 2112, at a fourth time, fourth capacitance data 116 is determined using the first set of sensor elements 150 operated in the second mode 1804. For example, the apparatus control module 132 determines reference capacitance data 256(2).

At 2114 second compensation data is determined based on the third and fourth capacitance data 116. For example, the compensation module 258 may determine the first compensation data based on a difference between the reference capacitance data 256(2) and the load capacitance data 254 (2). In another example, the compensation module 258 may determine the first compensation data based on a lookup table, mathematical function, or ratio, that is representative of a relationship between the load capacitance data 254(2) and the reference capacitance data 256(2).

At 2116, based on the third capacitance data 116 and the second compensation data, second compensated capacitance data is determined. For example, the compensation module 258 may multiply the load capacitance data 254(2) by a correction factor to determine the second compensated capacitance data.

At 2118, based on the first compensated capacitance data and the second compensated capacitance data, first change data is determined.

At 2120, based on the first change data, interaction data 128 indicative of an interaction with a lane 104 associated with the first set of sensor elements 150 is generated.

Figure 22:
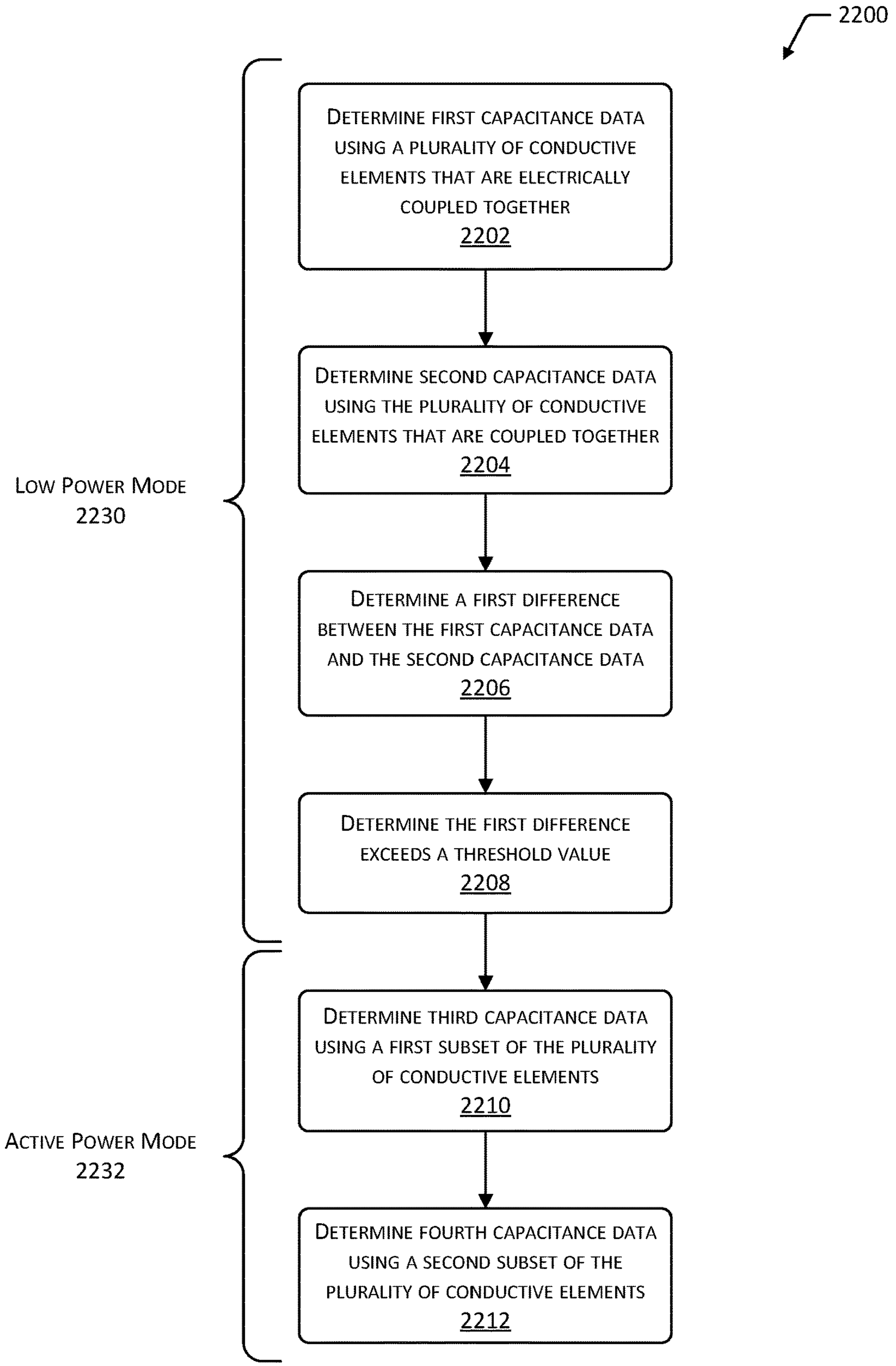
FIG. 22 is a flow diagram of a process for combining operation of the sensor elements to determine proximity of an object, according to some implementations.

FIG. 22 is a flow diagram 2200 of a process for combining operation of the sensor elements 150 to determine proximity of an object, according to some implementations. The process may be implemented at least in part by the apparatus control module 132.

The apparatus 102 may be operated in a low-power mode. Use of the low-power mode may be desired to allow extended operational times using a battery, to minimize heat dissipation such as when the apparatus 102 is located within a controlled climate such as a freezer or refrigerated case, to minimize power consumption, and so forth.

While in a low-power mode 2230, the apparatus 102 may consume less electrical power than while operating in an active power mode 2232. For example, the low power mode 2230 may utilize a lower sampling rate than the active power mode 2232, may operate the onboard electronics at a lower clock frequency, may use a different scan pattern of the sensor elements 150 as described with regard to this figure, and so forth.

The apparatus control module 132 may be operated as a proximity sensor, such that the switch module 212 connects a plurality of the conductive elements 250 to provide a relatively large area self-capacitance sensor that is responsive to the approach of a user 108 or other object. Once an object has been detected, the apparatus 102 may transition to the active power mode 2232.

At 2202 first capacitance data 116 is determined using a plurality of conductive elements 250 that are electrically coupled together. For example, the switch module 212 may connect the first conductive element 250(1) of the first set of sensor elements 150 and the first conductive element 250(1) of the second set of sensor elements 150 to the capacitive signal source of the capacitive sensor module 206. The capacitive sensor module 206 may then be operated to determine the raw capacitance data 252. In some implementations, the compensation process described above with regard to FIG. 21 may be used, and compensated capacitance data may be determined.

In another example, the first conductive element 250(1) of a first sensor element 150(1) may be connected to the capacitive signal source of the capacitive sensor module 206 and the first conductive element 250(1) of a second sensor element 150(2) may be connected to the ground 248.

In some implementations, the apparatus 102 may be operating in the low power mode 2230 at 2202. The capacitive sensor module 206 may operate in a high sensitivity mode, such that the approach of the user 108 or another object may be detected.

At 2204 second capacitance data 116 is determined using the plurality of conductive elements 250 that are electrically coupled together. In some implementations, the compensation process described above with regard to FIG. 21 may be used, and compensated capacitance data may be determined.

At 2206 a first difference is determined between the first capacitance data 116 and the second capacitance data 116.

At 2208 the first difference is determined to exceed a threshold value. This may be considered indicative of an approach of an object to the apparatus 102, such as a user 108.

In another implementation, operations 2204-2208 may be omitted, and the first capacitance data 116 may be compared to a threshold value. If a value of the first capacitance data 116 exceeds the threshold value, this may be considered indicative of an approach of an object to the apparatus 102, such as the user 108.

Responsive to the determination of an object, the process may transition to the active power mode 2232. The capacitive sensor module 206 may operate in a low sensitivity mode.

For example, the apparatus 102 may be operated in a proximity detection mode that determines capacitance data 116 at a low sample rate, such as once every 500 milliseconds, and for a specified set of sensor elements 150, such as all. Upon determining the presence of an object, such as the user 108, the apparatus 102 may transition from a low power mode 2230 to an active power mode 2232 and proceed to 2210 during which capacitance data 116 is determined at a faster sample rate such as every 100 ms and for sets of sensor elements 150 that are associated with particular lanes 104.

At 2210 third capacitance data is determined using a first subset of the plurality of conductive elements 250. For example, the conductive elements 250 associated with a first sensor element 150(1) associated with a first lane 104(1) may be operated.

At 2212 fourth capacitance data is determined using a second subset of the plurality of conductive elements 250. For example, the conductive elements 250 associated with a third sensor element 150(3) associated with a second lane 104(2) may be operated.

Figure 23:
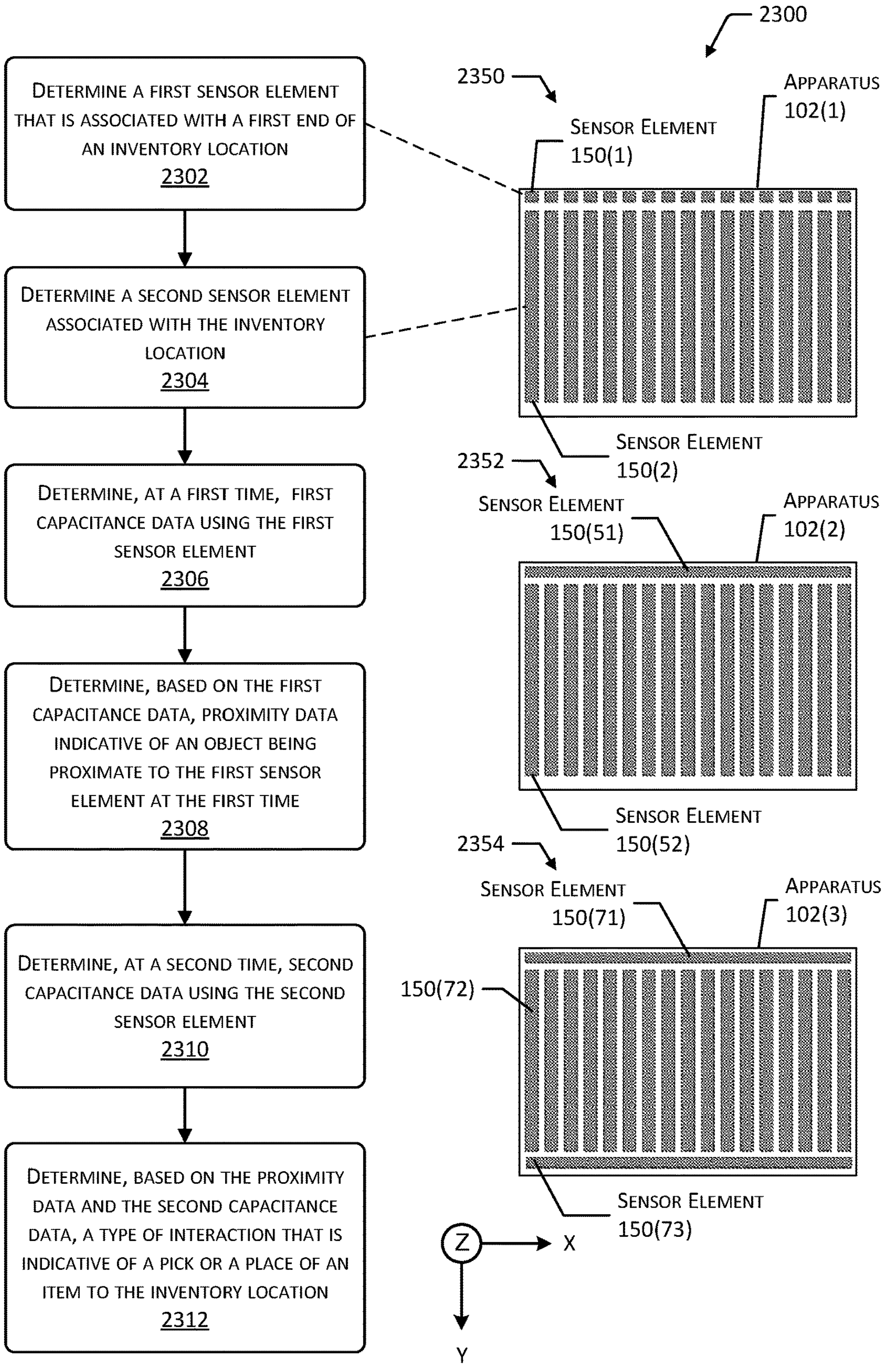
FIG. 23 is a flow diagram of a process for using a first sensor element proximate to a second sensor element to determine a type of interaction, according to some implementations.

FIG. 23 is a flow diagram 2300 of a process for using a first sensor element 150 proximate to a second sensor element 150 to determine a type of interaction, according to some implementations. The process may be implemented at least in part by the apparatus control module 132. In some implementations the apparatus 102 may be utilized from the front and the back. For example, the apparatus 102 may be restocked by having items 106 placed to the back, while items 106 are picked from the front. In another example, the apparatus 102 may be accessible by users 108 from the front and back, and items 106 may be interacted with from either. In still other examples, the apparatus 102 may be accessible by users 108 from the left or right sides, and items 106 may be interacted with from either.

In such implementations, additional information as to which side an interaction is taking place may be advantageous in determining the interaction data 128.

In a first implementation shown at 2350, the apparatus 102(1) comprises a first sensor element 150(1) that is associated with a first end of an inventory location, such as a lane 104, and a second sensor element 150(2) that is associated with the inventory location.

In a second implementation shown at 2352, the apparatus 102(2) comprises a first sensor element 150(51) that is associated with a first end of an inventory location and extends across a width of the apparatus 102(2), and a second sensor element 150(52) is associated with the inventory location. The first sensor element 150(51) has a first long axis that extends along the X axis, while the second sensor element 150(52) has a second long axis that extends along the Y axis, placing the first long axis perpendicular to the second long axis.

In a third implementation shown at 2354, the apparatus 102(3) comprises a first sensor element 150(71) that is associated with a first end of an inventory location and extends across a width of the apparatus 102(3), a second sensor element 150(72) is associated with the inventory location, and a third sensor element 150(73) that is associated with a second end of the inventory location and extends across the width of the apparatus 102(3).

At 2302 a first sensor element 150(1) that is associated with a first end of the inventory location is determined.

At 2304 a second sensor element 150(2) that is associated with the inventory location is determined. For example, the apparatus control module 132 may retrieve lane configuration data 130 that indicates the first sensor element 150(1) and the second sensor element 150(2) are associated with a particular lane 104.

At 2306 first capacitance data 116 is determined using the first sensor element 150(1).

At 2308, based on the first capacitance data 116, proximity data indicative of an object being proximate to the first sensor element 150(1) at the first time is determined. For example, if the value(s) of the first capacitance data 116 exceeds a threshold value, an object may be deemed to be proximate to the first sensor element 150(1). In another example, if a difference in successively measured capacitance data 116 exceeds a threshold value, an object may be deemed to be proximate to the first sensor element 150(1).

At 2310, at a second time, second capacitance data 116 is determined using the second sensor element 150(2).

At 2312, based on the proximity data and the second capacitance data 116, a type of interaction associated with the second sensor element 150(2) is determined. The type of interaction may be indicative of a relative location of a side of the apparatus 102 that is involved in a change, a pick, or place of an item 106 to the inventory location. For example, the first sensor element 150(1) may be associated with a front of the apparatus 102. If the proximity data indicates the first sensor element 150(1) detects an object at the first time, and then a change in capacitance at the second sensor element 150(2) is determined at the second time, the type of interaction may be deemed to be associated with the front of the apparatus 102. In comparison, if the proximity data indicates no object detected at the first time, but a change is detected at the second time, the type of interaction may be associated with the back of the apparatus 102. In some implementations, the location of the interaction, such as front or back may be further associated with a type of interaction. For example, the apparatus 102 may be restocked by placing items 106 at the back, while users 108 pick items 106 from the front. Based on this information, the type of interaction may be determined.

Given the lane configuration data 130 that associated the second sensor element 150(2) with a particular lane 104, the location of the interaction may be determined. As a result, the type of the interaction and location of the interaction may be determined. Additional information such as the mathematical sign of the change in capacitance as provided by the capacitance data 116 acquired at successive times may be used to determine whether a pick or place occurred, and in some implementations a count of the items 106 picked or placed.

Embodiments may be provided as a software program or computer program product including a non-transitory computer-readable storage medium having stored thereon instructions (in compressed or uncompressed form) that may be used to program a computer (or other electronic device) to perform processes or methods described herein. The computer-readable storage medium may be one or more of an electronic storage medium, a magnetic storage medium, an optical storage medium, a quantum storage medium, and so forth. For example, the computer-readable storage media may include, but is not limited to, hard drives, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case, and a variety of alternative implementations will be understood by those having ordinary skill in the art.

Additionally, those having ordinary skill in the art will readily recognize that the techniques described above can be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features and acts are disclosed as illustrative forms of implementing the claims.

What is claimed is:

1. A method comprising:

determining a first set of sensor elements that are associated with a first lane;

operating switch circuitry to:

connect a first set of conductive elements, that are associated with the first set of sensor elements, to a signal source;

connect a second set of conductive elements, that are associated with the first set of sensor elements, to a shield signal source; and connect a third set of conductive elements, that are associated with the first set of sensor elements, to ground;

generating a first signal using the signal source;

generating a second signal using the shield signal source;

determining first capacitance data based on the first signal;

operating the switch circuitry to:

connect a fourth set of conductive elements, that are associated with a second set of sensor elements, to the signal source;

connect a fifth set of conductive elements, that are associated with the second set of sensor elements, to the shield signal source; and connect a sixth set of conductive elements, that are associated with the second set of sensor elements, to the ground;

generating a third signal using the signal source;

generating a fourth signal using the shield signal source;

determining second capacitance data based on the third signal;

determining a first item has been added to or removed from the first lane at a first time;

determining, using the first set of sensor elements after the first time, third capacitance data;

determining, using the second set of sensor elements, fourth capacitance data after the first time;

determining a first difference between the first capacitance data and the third capacitance data;

determining a second difference between the second capacitance data and the fourth capacitance data; and determining, based on the first difference and the second difference, an association between the first lane and one or more of: the first set of sensor elements or the second set of sensor elements.

2. The method of claim 1, wherein:

respective ones of the second set of conductive elements are arranged:

directly beneath respective ones of the third set of conductive elements, and directly beneath respective ones of the first set of conductive elements; and the respective ones of the first set of conductive elements are arranged between respective ones of the second set of conductive elements.

3. The method of claim 1, wherein:

respective ones of the third set of conductive elements are arranged:

directly above respective ones of the second set of conductive elements, and directly beneath respective ones of the first set of conductive elements; and the first set of conductive elements are arranged between respective ones of the second set of conductive elements and the third set of conductive elements.

4. The method of claim 1, further comprising:

determining, based on the second capacitance data, proximity of an object to the first set of sensor elements and the second set of sensor elements.

5. The method of claim 1, wherein:

the first set of sensor elements has a first end, a second end, and a first long axis that extends through the first end and the second end; and the second set of sensor elements are proximate to the first end and have a second long axis that is perpendicular to the first long axis; and the method further comprising:

determining, based on the first capacitance data and the second capacitance data, data indicative of a type of interaction.

6. The method of claim 5, further comprising:

determining, based at least on the first capacitance data and the data indicative of the type of interaction, data indicative of a pick or a place of the first item that is stowed at the first lane.

7. The method of claim 1, further comprising:

determining a magnitude of the first difference exceeds a threshold value; and updating a counter value based on a sign of the first difference.

8. The method of claim 1, further comprising:

determining a magnitude of the first difference exceeds a threshold value;

updating a counter value based on a sign of the first difference;

determining fifth capacitance data using at least the first set of sensor elements;

determining a third difference between the first capacitance data and the fifth capacitance data;

determining a magnitude of the third difference exceeds the threshold value; and updating the counter value based on a sign of the third difference.

9. An apparatus comprising:

a cover layer;

a first plurality of sensor elements, wherein each sensor element comprises:

a first conductive element located beneath the cover layer;

a second conductive element located beneath the first conductive element; and a third conductive element located beneath the cover layer;

a plurality of conductors that couple the first conductive element, the second conductive element, and the third conductive element of respective sensor elements to a first set of electronics; and the first set of electronics to:

connect a first conductive element of a first set of sensor elements to a signal source;

connect a second conductive element of the first set of sensor elements to a shield signal source;

connect a third conductive element of the first set of sensor elements to ground;

generate a first signal using the signal source;

generate a second signal using the shield signal source;

determine first capacitance data based on the first signal;

connect a fourth conductive element of a second sensor element to the signal source;

connect a fifth conductive element of the second sensor element to the shield signal source;

connect a sixth conductive element of the second sensor element to the ground;

generate a third signal using the signal source;

generate a fourth signal using the shield signal source;

determine second capacitance data based on the third signal; and determine, based on the second capacitance data, proximity of an object to the first set of sensor elements and the second set of sensor elements.

10. The apparatus of claim 9, further comprising:

the second sensor element comprising:

the fourth conductive element located beneath the cover layer;

the fifth conductive element located beneath the fourth conductive element; and the sixth conductive element located beneath the fifth conductive element;

a second plurality of conductors that couple the fourth conductive element, the fifth conductive element, and the sixth conductive element to the first set of electronics; and the first set of electronics to:

determine compensated capacitance data based on the first capacitance data and the second capacitance data.

11. The apparatus of claim 9, wherein the first set of sensor elements has a first end, a second end, and a first axis that extends through the first end and the second end;

the second sensor element is arranged proximate to the first end and has a second axis that is perpendicular to the first axis; and the first set of electronics to:

determine, based on the first capacitance data and the second capacitance data, data indicative of a pick or a place of an item that is stowed proximate to the apparatus.

12. A system comprising:

an apparatus comprising:

a cover layer;

a first plurality of sensor elements that are associated with a first lane, wherein each sensor element comprises:

a first conductive element located beneath the cover layer, a second conductive element located beneath the first conductive element, and a third conductive element located beneath the cover layer; and a plurality of conductors that couple the first conductive element, the second conductive element, and the third conductive element of respective sensor elements to a first set of electronics; and the first set of electronics executing instructions to:

connect the first conductive element of a first set of sensor elements to a signal source;

connect the second conductive element of the first set of sensor elements to a shield signal source;

connect the third conductive element of the first set of sensor elements to ground;

generate a first signal using the signal source;

generate a second signal using the shield signal source;

determine first capacitance data based on the first signal;

connect a fourth conductive element of a second sensor element to the signal source;

connect a fifth conductive element of the second sensor element to the shield signal source;

connect a sixth conductive element of the second sensor element to the ground;

generate a third signal using the signal source;

generate a fourth signal using the shield signal source;

determine second capacitance data based on the third signal; and determine, based on the first capacitance data and the second capacitance data, data indicative of a type of interaction with the apparatus.

13. The system of claim 12, further comprising:

the apparatus further comprising:

the second sensor element comprising:

the fourth conductive element located beneath the cover layer;

the fifth conductive element located beneath the fourth conductive element; and the sixth conductive element a second plurality of conductors that couple the fourth conductive element, the fifth conductive element, and the sixth conductive element to the first set of electronics; and the first set of electronics executing instructions to:

determine compensated capacitance data based on the first capacitance data and the second capacitance data.

14. The system of claim 12, the first set of electronics executing instructions to:

determine, based on the second capacitance data, proximity of an object to the first set of sensor elements and the second sensor element.

15. The system of claim 12, wherein:

the first set of sensor elements has a first end, a second end, and a first long axis that extends through the first end and the second end; and the second sensor element is arranged proximate to the first end and has a second long axis that is perpendicular to the first long axis.

16. The system of claim 15, the first set of electronics executing instructions to:

determine, based at least on the first capacitance data and the data indicative of the type of interaction with the apparatus, data indicative of a pick or a place of an item that is stowed at the first lane.

17. The system of claim 12, the first set of electronics executing instructions to:

determine third capacitance data using at least the first set of sensor elements;

determine change data based on the first capacitance data and the third capacitance data;

determine a magnitude of the change data exceeds a threshold value; and update a counter value based on a sign of the change data.

18. The system of claim 12, the first set of electronics executing instructions to:

determine third capacitance data using at least the first set of sensor elements;

determine first change data based on the first capacitance data and the third capacitance data;

determine a first magnitude of the first change data exceeds a threshold value;

update a counter value based on a sign of the first change data;

determine fourth capacitance data using at least the first set of sensor elements;

determine second change data based on the first capacitance data and the fourth capacitance data;

determine a second magnitude of the second change data exceeds the threshold value; and update the counter value based on a sign of the second change data.

19. The system of claim 12, the first set of electronics executing instructions to:

determine an item has been added to or removed from the first lane at a first time;

determine, using the first set of sensor elements after the first time, third capacitance data;

determine, using a second set of sensor elements, fourth capacitance data after the first time;

determine a first difference between the first capacitance data and the third capacitance data;

determine a second difference between the second capacitance data and the fourth capacitance data; and determine, based on the first difference and the second difference, an association between the first lane and one or more of: the first set of sensor elements or the second set of sensor elements.

20. The apparatus of claim 9, wherein:

the first set of sensor elements has a first end, a second end, and a first long axis that extends through the first end and the second end;

the second sensor element is proximate to the first end and has a second long axis that is perpendicular to the first long axis; and the first set of electronics to:

determine, based on the first capacitance data and the second capacitance data, data indicative of a type of interaction.

* * * * *